United States Patent
Wang et al.

(10) Patent No.: US 7,141,274 B2
(45) Date of Patent: Nov. 28, 2006

(54) SUBSTRATE PROCESSING APPARATUS AND METHOD

(75) Inventors: Xinming Wang, Tokyo (JP); Kenichi Abe, Tokyo (JP); Koji Mishima, Tokyo (JP)

(73) Assignee: Ebara Corporation, Tokyo (JP)

( * ) Notice: Subject to any disclaimer, the term of this patent is extended or adjusted under 35 U.S.C. 154(b) by 91 days.

(21) Appl. No.: 10/482,117

(22) PCT Filed: Nov. 6, 2002

(86) PCT No.: PCT/JP02/11573

§ 371 (c)(1),
(2), (4) Date: Jun. 28, 2004

(87) PCT Pub. No.: WO03/040430

PCT Pub. Date: May 15, 2003

(65) Prior Publication Data

US 2004/0231997 A1 Nov. 25, 2004

(30) Foreign Application Priority Data

Nov. 7, 2001 (JP) .............................. 2001-341889

(51) Int. Cl.
*B05D 1/18* (2006.01)
(52) U.S. Cl. .................. 427/430.1; 205/224; 205/209; 204/224 R; 427/434.3; 118/59; 118/666
(58) Field of Classification Search ................ 118/423, 118/428, 59, 666; 427/434.5, 241, 430.1, 427/434.3; 438/678; 205/209, 95, 118, 205/123, 133; 204/241, 275; 219/410, 417; 392/418
See application file for complete search history.

(56) References Cited

U.S. PATENT DOCUMENTS 6,042,712 A * 3/2000 Mathieu ..................... 205/209

FOREIGN PATENT DOCUMENTS

| JP | 4-32572 | 2/1992 |
| JP | 9-246215 | 9/1997 |
| JP | 11-80968 | 3/1999 |

* cited by examiner

*Primary Examiner*—Erma Cameron
*Assistant Examiner*—Howard Abramowitz
(74) *Attorney, Agent, or Firm*—Wenderoth, Lind & Ponack, L.L.P.

(57) ABSTRACT

A substrate processing apparatus and method which employs the so-called batch processing method of processing a plurality of substrates simultaneously, thereby increasing the throughput, and which can carry out processing, such as electroless plating, stably and securely with a relatively simple apparatus. The substrate processing apparatus includes: a processing bath (14) for holding a processing liquid (12); and a substrate holder (16) which is vertically movable relative to the processing bath (14) and which includes a plurality of substrate holding portions (40) for holding a plurality of substrates (W) in parallel. Each substrate holding portion (40) has a substrate stage (48) and a substrate presser (54), which can move close to or away from each other and can grip therebetween a peripheral portion of a substrate to thereby hold the substrate with its back surface sealed, and has a heating medium flow passage (62) for passing a heating medium therethrough so as to regulate the temperature of the substrate holding portion (40).

13 Claims, 22 Drawing Sheets

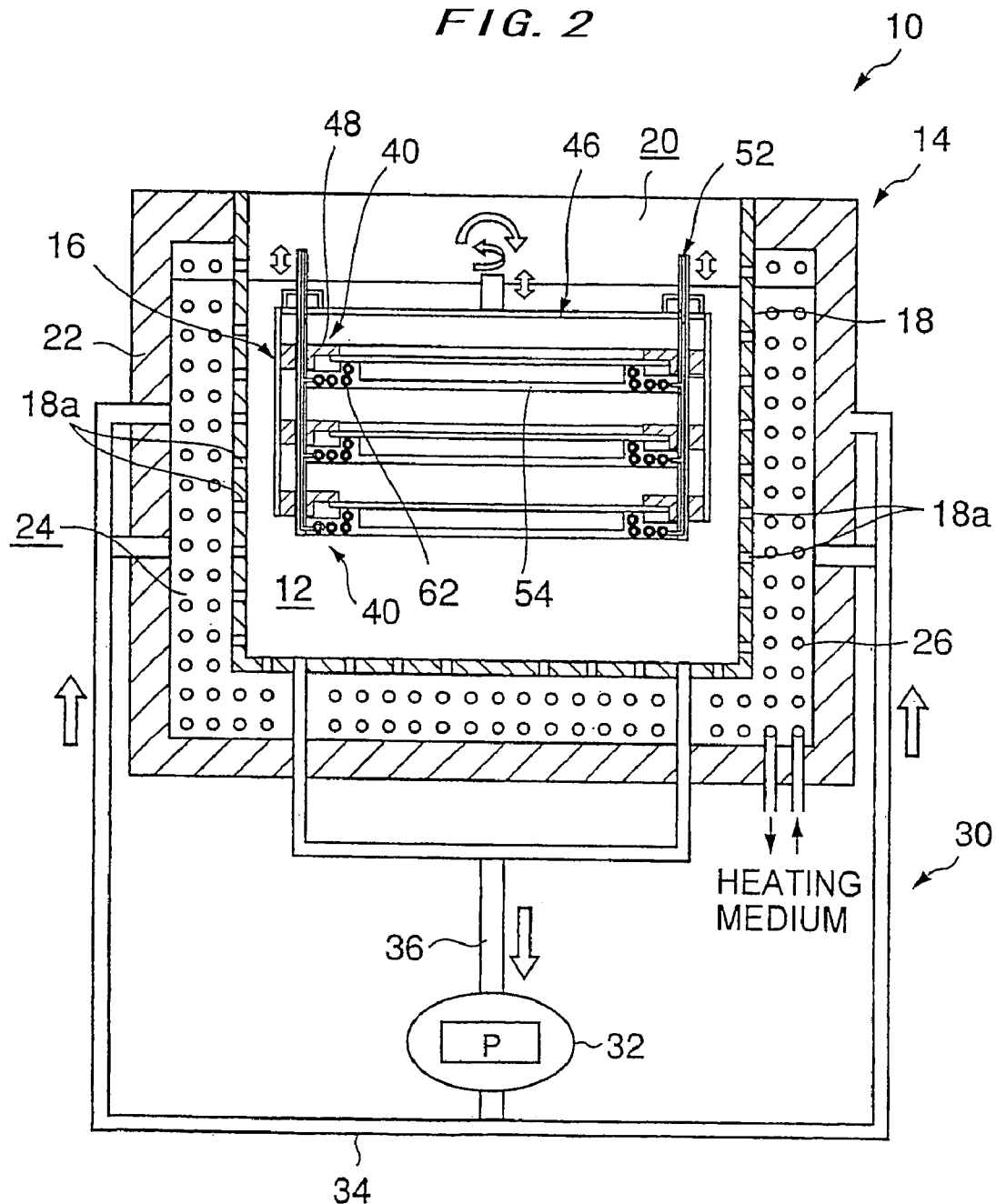

SUBSTRATE PROCESSING APPARATUS AND METHOD

BACKGROUND OF THE INVENTION

1. Technical Field of the Invention

This invention relates to a substrate processing apparatus and method, more particularly, relates to a substrate processing apparatus and method useful for forming embedded interconnects that an electric conductor, such as copper or silver, is embedded in fine recesses for interconnects formed in the surface of a substrate like a semiconductor substrate, and for forming a protective layer for protecting the surface of the interconnects.

2. Description of the Related Art

An electroless plating is such a method that a plated film is formed on a plating surface of a workpiece by chemically reducing metal ions in a plating solution without supplying any electric current from the outside, and the electroless plating is widely used in a nickel-phosphorus plating and a nickel-boron plating for giving a corrosion resistance and a wear resistance, and a copper plating for a printed-wiring substrate.

As an electroless plating apparatus, there has been generally known an apparatus comprising a plating bath for holding an electroless plating solution which overflows during plating process, and a vertically movable holding portion disposed above the plating bath for holding a plating workpiece, such as a substrate, whereby the workpiece held by the holding portion is dipped into the plating solution in the plating bath.

In recent years, as the processing speed and integration of a semiconductor chip becomes higher, there has been a growing tendency to replace aluminum or aluminum alloy with copper having a low electric resistivity and a high electromigration resistance as metallic materials for forming interconnection circuits on the semiconductor substrate. These kinds of copper interconnects are generally formed by filling fine recesses formed in the surface of the substrate with copper. As a method for forming the copper interconnects, CVD, sputtering, and plating are known, but plating is generally used. In any case, after a copper film is deposited on the surface of the substrate, the surface of the substrate is polished to a flat finish by chemical mechanical polishing (CMP) process.

In the case of interconnects formed by such a process, the embedded interconnects have an exposed surface after the flattening processing. When an additional embedded interconnect structure is formed on such an exposed surface of interconnects of a semiconductor substrate, the following problems may be encountered. For example, during the formation of a new $SiO_2$ interlevel dielectric, the exposed surface of the pre-formed interconnects is likely to be oxidized. Further, upon etching of the $SiO_2$ layer for the formation of contact holes, the pre-formed interconnects exposed at the bottoms of the contact holes can be contaminated with an etchant, a peeled resist, etc. Moreover, in the case of copper interconnects, there is a fear of copper diffusion.

In view of this, in the case of copper interconnects, for example, it may be considered to selectively cover the surface of copper interconnects with a protective layer (plated film) of a Ni—B alloy or the like, having a good adhesion to copper and a low resistivity ($\rho$). The Ni—B alloy layer can be formed on the surface of e.g. copper selectively by using an electroless plating solution that contains nickel ions, a complexing agent for nickel ions and an alkylamine borane or a borohydride compound as a reducing agent for nickel ions and by immersing the surface of the substrate in the electroless plating solution.

An electroless plating is applied to main filling materials (Cu) for the copper interconnects, the formation of the seed layer on the barrier metal, or the reinforcement of the seed (Cu), further the formation of the barrier metal itself, or the formation of cap material for the copper interconnect (in any case, Ni—P, Ni—B, Co—P, Ni—W—P, Ni—Co—P, Co—W—P, Co—W—B), or the like. In any electroless plating process, uniformity of the film thickness over an entire surface of the substrate is required.

In electroless plating, when a plating surface of a workpiece is brought into contact with an electroless plating solution, a plating metal instantly begins to deposit on the plating surface of the material, and the deposition rate of the plating metal varies depending on the temperature of the plating solution. Accordingly, in order to form a plated film having a uniform film thickness over the plating surface of a workpiece, the temperature of a plating solution is required to be uniform all over the surface of the material from the initial time of contact between the workpiece and the plating solution, and the uniform plating temperature must be kept throughout the plating treatment.

In order to meet this demand, conventional electro less plating apparatuses are generally designed to perform plating in such a manner that the plating surface of a substrate is allowed to be in contact with a plating solution which has previously been heated to a predetermined temperature, and the substrate and the plating solution are heated (kept warm) during plating by means of a heater, a lamp, or the like in order to maintain the plating temperature. Further, with a view to obtaining uniformity of the plating temperature, the conventional electroless plating apparatuses generally employ the so-called one-by-one processing method of processing one substrate in one plating processing. Also with substrate processing apparatuses for carrying out processing incidental to plating, such as pre-plating processing and post-plating cleaning, because of the one-by-one plating processing, the one-by-one processing method has conventionally been employed.

Such conventional substrate processing apparatuses, which employ the one-by-one processing method, necessarily involve the problem of poor throughput. Further, as described above, a conventional electroless plating apparatus needs the provision of a device for heating (keeping warm) substrate or a plating solution. In the case of a pre-plating processing apparatus of a spray type, incidental equipments, such as pressure pump, a nozzle and a pipe, are needed. The conventional substrate processing apparatuses are thus likely to be complicated, leading an increased production cost.

The above and other objects, features, and advantages of the present invention will be apparent from the following description when taken in conjunction with the accompanying drawings which illustrates preferred embodiments of the present invention by way of example.

SUMMARY OF THE INVENTION

The present invention has been made in view of the above drawbacks in the related art. It is therefore an object of the present invention to provide a substrate processing apparatus and method which employs the so-called batch processing method of processing a plurality of substrates simultaneously, thereby increasing the throughput, and which can carry out processing, such as electroless plating, stably and securely with a relatively simple apparatus.

In order to achieve the above object, the present invention provides a substrate processing apparatus comprising: a processing bath for holding a processing liquid; and a substrate holder which is vertically movable relative to the processing bath and which includes a plurality of substrate holding portions for holding a plurality of substrates in parallel; wherein each substrate holding portion has a substrate stage and a substrate presser, which can move close to or away from each other and can grip therebetween a peripheral portion of a substrate to thereby hold the substrate with its back surface sealed, and has a heating medium flow passage for passing a heating medium therethrough so as to regulate the temperature of the substrate holding portion.

According to the substrate processing apparatus, the provision of the substrate holding portions each of which has a heating medium flow passage makes it possible to regulate the temperature of the substrate holding portions as a whole, which have a large volume for holding a plurality of substrates and hence have a large heat capacity, to the temperature of a processing liquid. Thus, the temperature of the substrate holder with a plurality of substrates held in the substrate holding portions can be regulated to the temperature of the processing liquid in the processing bath before immersing it in the processing liquid. This makes it possible to process the plurality of substrates simultaneously while preventing a change of the temperature of the processing liquid upon immersion of the substrate holder.

The substrate processing apparatus may further comprise a processing liquid circulation system for circulating a processing liquid in the processing bath. This makes it possible to keep the processing liquid in the processing bath at a uniform temperature and control the processing liquid so that the composition, temperature, etc. thereof are kept constant.

It is preferred that the heating medium flow passage be provided in the interior of the substrate presser. The provision of the heating medium flow passage in the substrate presser, which has a larger heat capacity than the substrate stage, can more efficiently regulate the temperature of the substrate holding portion.

In a preferred embodiment, the substrate processing apparatus is provided with a pressurized fluid introduction section for introducing a pressurized fluid into a space which is formed between the substrate presser and the substrate when the substrate is held in the substrate holding portion. The pressurized fluid can press the substrate against the substrate stage at a uniform pressure, thereby more securely sealing the back surface of the substrate.

Preferably, the substrate holder is so designed that it can make at least one of rotational movement and tilting movement. This allows the plurality of substrates held in the respective substrate holding portions and immersed in the processing liquid in the processing bath to be in contact with the processing liquid more uniformly, enabling a uniform processing of the respective substrates.

The present invention also provides a substrate processing method comprising: allowing a plurality of substrates to be held in parallel in a plurality of substrate holding portions of a substrate holder; introducing a heating fluid into each substrate holding portion to regulate the temperature of the substrate holding portion; and immersing the plurality of substrates held in the substrate holding portions in a processing liquid held in a processing bath to carry out processing of the substrates.

In a preferred embodiment, the plurality of substrates are kept immersed in the processing liquid while allowing the substrates to make a vertical movement, rotational movement, tilting movement, or a combined movement thereof.

The present invention also provides a substrate plating apparatus comprising: a plating bath for holding a plating solution; a plating solution circulation system for circulating the plating solution in the plating bath; and a substrate holder which is vertically movable relative to the plating bath and which includes a plurality of substrate holding portions for holding a plurality of substrates in parallel, wherein each substrate holding portion has a substrate stage and a substrate presser, which can move close to or away from each other and can grip therebetween a peripheral portion of a substrate to thereby hold the substrate with its back surface sealed, and has a heating medium flow passage for passing a heating medium therethrough so as to control the temperature of the substrate holding portion.

According to the substrate plating apparatus, the provision of the substrate holding portions each of which has a heating medium flow passage makes it possible to regulate the temperature of the substrate holding portions as a whole, which have a large volume for holding a plurality of substrates and hence have a large heat capacity, to the temperature of a plating solution. Thus, the temperature of the substrate holder with a plurality of substrates held in the substrate holding portions can be regulated to the temperature of the plating solution in the plating before immersing it in the plating bath. This makes it possible to perform simultaneous plating processing of the plurality of substrates while preventing a change (lowering) of the temperature of the plating solution upon immersion of the substrate holder.

The present invention also provides a substrate plating method comprising: allowing a plurality of substrates to be held in parallel in a plurality of substrate holding portions of a substrate holder; introducing a heating medium into each substrate holding portion to heat the substrate holding portion; and immersing the plurality of substrates thus held and heated by the substrate holding portions into a plating solution held in a plating bath to carry out plating of the substrates, wherein a flow of the plating solution is stopped throughout the plating.

According to the substrate plating method, a flow of plating solution is stopped during the progress of plating. This can prevent a flow of plating solution from affecting the results of plating. It is possible to allow the substrates, immersed in the plating solution, to make a movement (at least one of rotation, vertical movement and tilting) during the progress of plating so as to effectively remove hydrogen gas generated during plating and carry out plating stably.

BRIEF DESCRIPTION OF THE DRAWINGS

FIG. 2 is a cross-sectional view of a substrate processing apparatus applied to an electroless plating apparatus according to an embodiment of the present invention;

DETAILED DESCRIPTION OF THE INVENTION

Preferred embodiments of the present invention will now be described in detail with reference to the accompanying drawings, which in no way limit the invention.

Figure 1A:
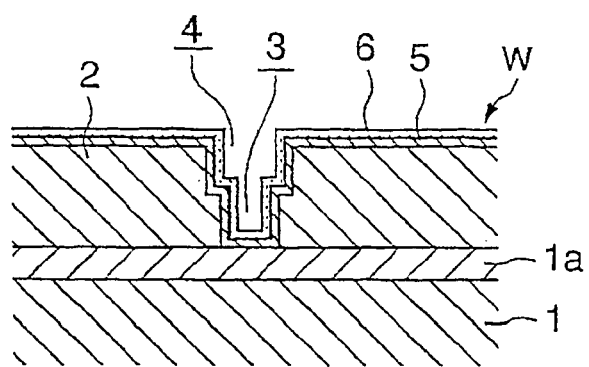
FIGS. 1A through 1D are diagrams illustrating, in sequence of process steps, an example of the formation of copper interconnects by copper plating and the formation of a protective layer for the copper interconnects.

FIGS. 1A through 1D illustrate, in sequence of process steps, an example of the formation of copper interconnects in a semiconductor device. As shown in FIG. 1A, an insulating film 2 of e.g. $SiO_2$ is deposited on a conductive layer 1a in which semiconductor devices are provided, which is formed on a semiconductor base 1. Contact holes 3 and trenches 4 for interconnects are formed in the insulating film 2 by the lithography/etching technique. Thereafter, a barrier layer 5 of TaN or the like is formed on the entire surface, and a copper seed layer 6 as an electric supply layer for electroplating is formed on the barrier layer 5, for example, by sputtering.

Figure 1B:
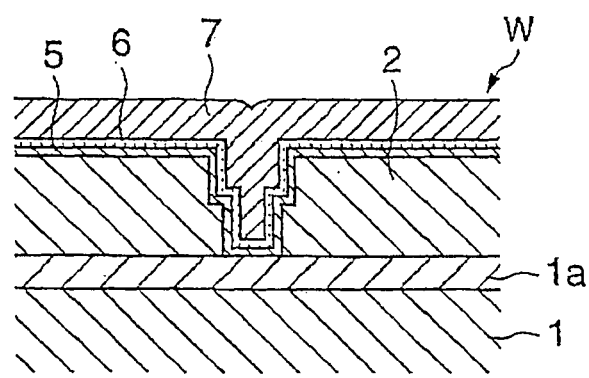
Figure 1C:
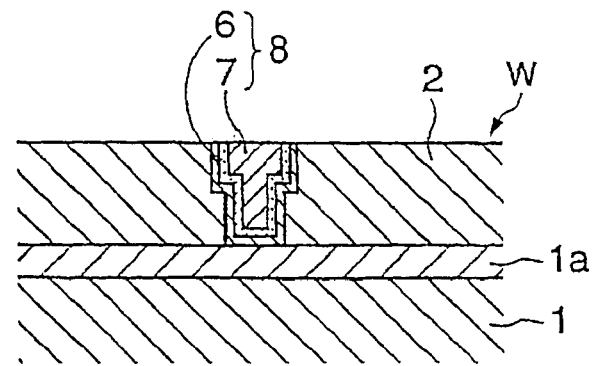
Figure 1D:
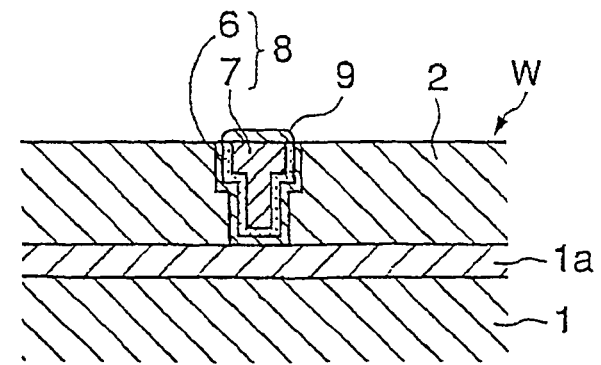

Thereafter, as shown in FIG. 1B, copper plating is carried out onto the surface of the semiconductor substrate W to fill the contact holes 3 and the trenches 4 with copper and, at the same time, deposit a copper film 7 on the insulating film 2. Thereafter, the copper film 7 and the barrier layer 5 on the insulating film 2 are removed by chemical mechanical polishing (CMP) so as to leave a surface of the copper film 7, filled in the contact holes 3 and the trenches 4 for interconnects and the surface of the insulating film 2 lying substantially in the same plane. Interconnects 8 composed of the copper seed layer 6 and the copper film 7, as shown in FIG. 1C, are thus formed in the insulating film 2. Next, electroless Ni—B plating, for example, is carried out onto the surface of the substrate W to form a protective layer (plated film) 9 composed of a Ni—B alloy selectively on the exposed surface of copper interconnects 8 to protect the interconnects 8, as shown in FIG. 1D.

Figure 3:
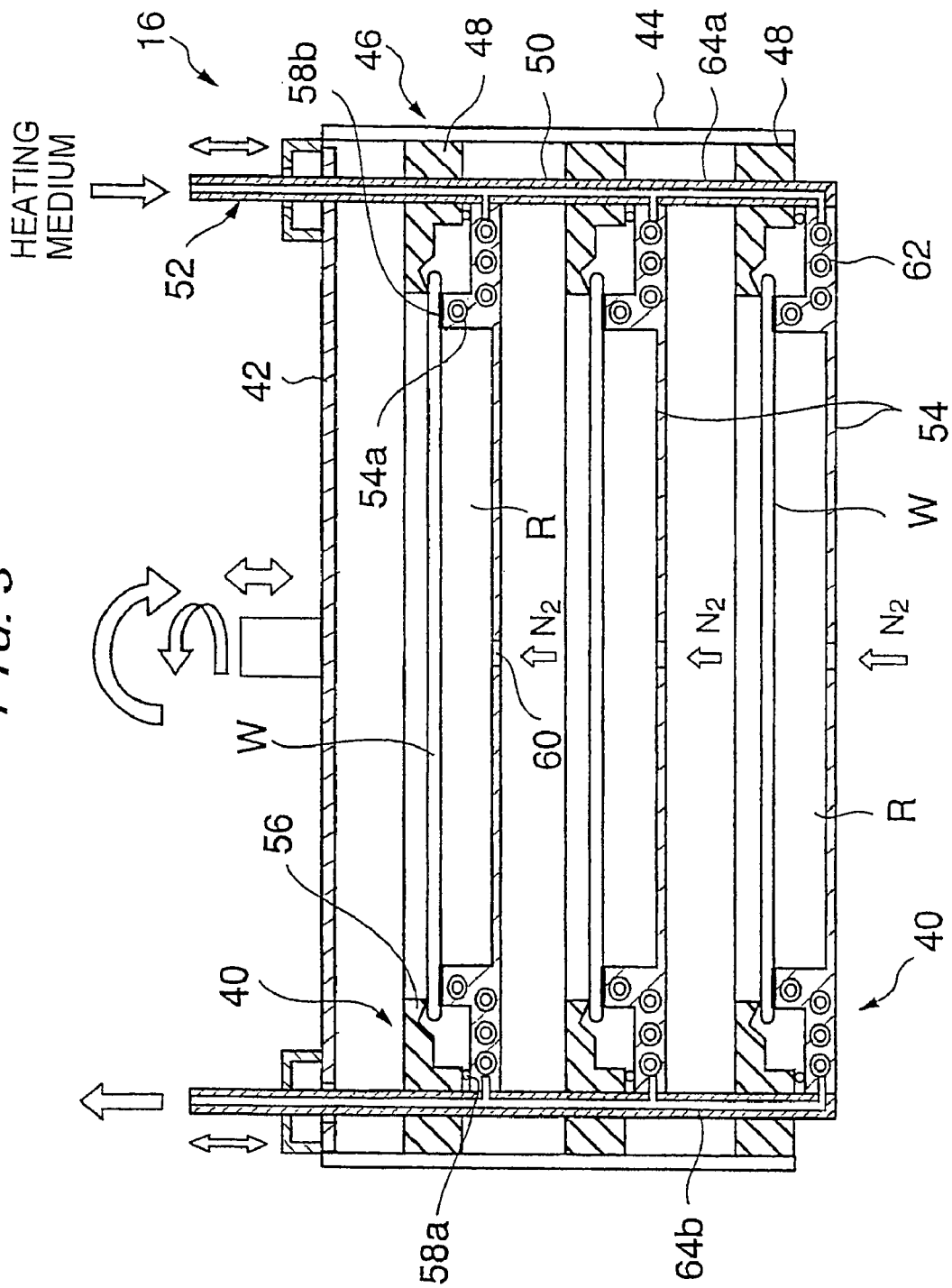
FIG. 3 is an enlarged view showing a substrate holder shown in FIG. 2.

FIGS. 2 and 3 show a substrate processing apparatus applied to an electroless plating apparatus according to an embodiment of the present invention. The electroless plating apparatus (substrate processing apparatus) can be used, for example, for the formation of the barrier layer 5 of FIG. 1, the reinforcement of the copper seed layer 6 and the deposition of the copper film 7, and also for the formation of the protective layer (plated film) 9.

The electroless plating apparatus 10 includes an upwardly-open plating bath (processing bath) 14 for holding a plating solution (processing liquid) 12 and carrying out plating, and a substrate holder 16, disposed vertically moveable between the interior of the plating bath 14 and above the plating bath 14, for holding a plurality of substrates W (three substrates shown in FIGS. 2 and 3), such as semiconductor wafers, simultaneously.

The plating bath 14, having a double bath structure, includes the upwardly-open inner bath 20 defined by an inner wall 18, and a closed outer bath 24 defined between the inner wall 18 and an outer wall 22 that surrounds the sides and bottom of the inner wall 18. A number of communicating holes 18a for communicating the inner bath 20 with the outer bath 24 are formed in the entire inner wall 18, so that the plating solution 12 in the inner bath 20 is in direct communication with the plating solution 12 in the outer bath 24 and the both plating solutions in the plating bath 14 always lie on the same level.

In the outer bath 24, there is provided a heating device that is composed of a heating tube 26, according to this embodiment, for passing therethrough a heating medium and heating the plating solution 12 in the plating bath 14 to e.g. 70° C.

The plating apparatus is also provided with a plating solution circulation system 30 for circulating the plating solution 12 in the plating bath 14. The plating solution circulation system 30 comprises a circulation pump 32, a plating solution discharge pipe 34 which connects the discharge outlet of the circulation pump 32 with the outer bath 24, and a plating solution suction pipe 36 which connects the suction inlet of the circulation pump 32 with the inner bath 20. The circulation pump 32, when actuated, sucks the plating solution 12 from the inner bath 20 and returns it to the outer bath 24. The plating solution 12 in the plating bath 14 is thus circulated.

Further, by heating the plating solution 12 in the course of its circulation by a heating tube (heating device) 26 disposed in the outer bath 24, and especially by shutting off and keeping warm the plating solution 12 in the inner bath 20 by the plating solution 12 in the outer bath 24, the rise and retention of the temperature of the plating solution 12 can be made with ease and the plating solution 12 in the plating bath 14 can be controlled at a constant temperature. The temperature of the plating solution 12 is generally 25 to 90° C., preferably 55 to 85° C., more preferably 60 to 80° C.

According to this embodiment, the substrate holder 16 is so designed that it has three substrate holding portions 40, in which three substrates W in total can be held in parallel with one substrate in each substrate holding portion 40. Since the substrate holding portions 40 are of the same construction, a description thereof is herein given mainly with reference to one of them.

The substrate holder 16 includes a support frame 46, which is composed of a flat top plate 42 and a plurality of support rods 44 mounted vertically to certain points in a peripheral portion of the lower surface of the top plate 42, and a movable frame 52 composed of a plurality of movable rods 50 that can move vertically with reference to the support frame 46.

The substrate holding portion 40 is composed mainly of a ring-shaped substrate stage 48, the outer circumferential surface of which is fixed to the support rods 44 of the support frame 46, and a flat plate-shaped substrate presser 54, the circumferential surface of which is fixed to the movable rods 50 of the movable frame 52. According to this embodiment, the substrate presser 54 is positioned below the substrate stage 48, and the substrate W is held with its front surface (plating surface) facing upward.

To the inner periphery of the substrate stage 48 is mounted a ring-shaped seal ring 56, protruding downwardly in a pyramidal shape in section, for making a pressure contact with a peripheral portion of the upper surface (plating surface) of the substrate W to thereby seal the peripheral portion. Further, a ring-shaped outer seal member 58*a* is mounted on the lower surface of the substrate stage 48 which, when the substrate W is held in the substrate holding portion 40, is positioned outside of the substrate W. The substrate presser 54, on the other hand, is adapted for sealing the back surface (lower surface) of the substrate W when it is held in the substrate holding portion 40, thereby preventing the back surface of the substrate W from being plated. A ring-shaped convex portion 54*a* is formed in the substrate presser 54 so that a space R can be formed between the back surface of the substrate W and the substrate presser 54 when the substrate is held in the substrate holding portion 40. A ring-shaped inner seal member 58*b* is mounted on the upper surface of the convex portion 54*a*.

When the substrate W is placed, in a predetermined position, on the convex portion 54*a* of the substrate presser 54 and is then raised, the lower end of the seal ring 56 is brought into pressure contact with a peripheral portion of the front surface (upper surface) of the substrate W, the outer seal member 58*a* is brought into pressure contact with a peripheral portion of the upper surface of the substrate presser 54, and the inner seal member 58*b* is brought into pressure contact with a peripheral portion of the backs surface (lower surface) of the substrate W, whereby the peripheral region and the back surface of the substrate W are sealed.

Further, according to this embodiment, a pressurized fluid introduction section 60 is connected to the substrate presser 54. The pressurized fluid introduction section 60 introduces a pressurized fluid, such as $N_2$ gas, into the space R formed between the substrate presser 54 and the substrate W. When the substrate is held in the substrate holding portion 40 with its peripheral region and back surface sealed, as described above, and a pressurized fluid, such as a heated $N_2$ gas, is introduced into the space R, the pressurized gas presses the substrate W against the substrate stage 48 at a uniform pressure, thereby more securely sealing the peripheral region and the back surface of the substrate.

In the interior of the peripheral thick portion of the substrate presser 54, there is provided a heating medium flow passage, composed of a spiral circulation tube 62, for regulating the temperature of the substrate holding portion 40. The circulation tube (heating medium flow passage) 62 is connected to a heated fluid supply tube 64*a* and to a heated fluid discharge tube 64*b*, each extending within the movable rod 50. By thus allowing a heating medium to flow through the circulation tube 62, the temperature of the substrate presser 54 can be regulated.

In this embodiment, the substrate holder 16 is so designed that it can rotate, tilt (swing back and forth) and move vertically by the actuation of a motor, a cylinder, etc. (not shown).

According to the substrate holding portions 40 of this embodiment, when the respective substrate pressers 54 are in a lowered position relative to the respective substrate stages 48, the substrates W are dropped onto the upper surfaces of the substrate pressers 54 to place the substrates on them. By raising then the respective substrate pressers 54 relative to the respective substrate stages 48, the plurality of substrates W can be held all together in the substrate holding portions 40. The substrates W thus held in the substrate holding portions 40 are allowed to rotate, tilt and move vertically via the substrate holder 16.

As described above, when the substrate W is held in the substrate holding portion 40, the back surface of the substrate W is covered with the substrate presser 54 and the peripheral region of the substrate W is sealed with the seal ring 56 and the seal members 58*a*, 58*b*. Accordingly, when the substrate W held in the substrate holding portion 40 is immersed in the plating solution 12, the back surface and the peripheral region of the substrate W do not contact the plating solution 12, and therefore are not plated. Also as described above, the temperature of the substrate holding portion 40 can be regulated by introducing a heating medium at a controlled temperature into the circulation tube 62 provided in the interior of the substrate presser 54 of the substrate holding portion 40, and circulating the heating medium through the circulation tube 62.

The operation of the electroless plating apparatus of this embodiment will now be described.

While circulating the plating solution 12 in the plating bath 14, a heating medium is introduced into the heating tube 26 to heat the plating solution 12, thereby keeping the plating solution 12 in the plating bath 14 at a constant temperature, e.g. 70° C. On the other hand, when the substrate holder 16 is in a raised position relative to the plating bath 14 and the respective substrate pressers 54 are in a lowered position relative to the respective substrate stages 48, the substrates W are inserted into the substrate holder 16 and placed on the respective substrate pressers 54. Thereafter, the respective substrate pressers 54 are raised so as to seal the peripheral regions and the back surfaces of the substrates W with the seal ring 56 and the seal members 58*a*, 58*b*, and a pressurized fluid is introduced into the spaces R, thereby holding the plurality of substrates W all together.

Thereafter, a heating medium at a controlled temperature is introduced into and circulated through the circulation tube 62 provided within the substrate presser 54 of the substrate holding portion 40, thereby regulating the temperature of the substrate holding portion 40 to the plating temperature, e.g. 70° C.

While continuing the introduction of heating medium into the heating tube 26 and the introduction of heating medium into the circulation tube 62, the circulation pump 32 of the plating solution circulation system 30 is stopped, thereby stopping the circulation of the plating solution 12 in the plating bath 14. The substrate holder 16 is then lowered so as to immerse the plurality of substrates W, held in the substrate holding portions 40 of the substrate holder 16, in the plating solution 12 in the plating bath 14 simultaneously, and plating of the front surfaces (upper surfaces) of the respective substrates W is carried out for e.g. several minutes. During the plating, if necessary, the substrates W are rotated at a low speed (e.g. 1–10 rpm), moved vertically or tilted so as to equalize the density of hydrogen gas of the plating surface and the concentration of dissolved oxygen in the plating solution over the plating surface. It is possible to allow the substrates W to make a combined movement of the above movements.

By thus heating the substrate holding portions 40, which have a large volume for holding the plurality of substrates and hence have a large heat capacity, before immersing the substrate holder 16, with the plurality of substrates W held in the substrate holding portions 40, in the plating solution 12 at a high temperature in the plating bath 14, it becomes possible to carry out the simultaneous plating of the plurality of substrates W without suffering from a change (lowering) of the temperature of the plating solution upon immersion of the substrate holder 16. In addition, by continuing the heating of the plating solution 12 and the substrate holding portions 40 during the progress of plating, even when carrying out electroless plating for e.g. several minutes, the temperature of the plating solution 12 can be controlled within the variation range of ±1° C. during the plating.

Electroless plating, in general, is sensitively influenced by a flow of plating solution, and it is difficult to equalize the flow of plating solution over the entire plating solution bath. In this regard, according to this embodiment, the flow of the plating solution 12 in the plating bath 14 is stopped during the progress of plating, as described above. This can prevent the flow of plating solution from influencing the results of plating.

After completion of the plating, the substrate holder 16 is raised, and then the plating solution remaining on each plated surface is removed by suction or the like. Respective substrate holding portions 40 are then transferred to a cleaning position, etc. While rotating the substrate W, a cleaning liquid is jetted from a cleaning liquid nozzle (not shown) toward the plated surface of the substrate W, thereby cooling and, at the same, diluting and cleaning the plated surface, whereby the electroless plating reaction is terminated.

Thereafter, the respective substrate pressers 54 are lowered relative to the respective substrate stages 48, thereby releasing the plated substrates, and then the plated substrates are sent to the next process step e.g. by a hand of a robot.

Figure 4:
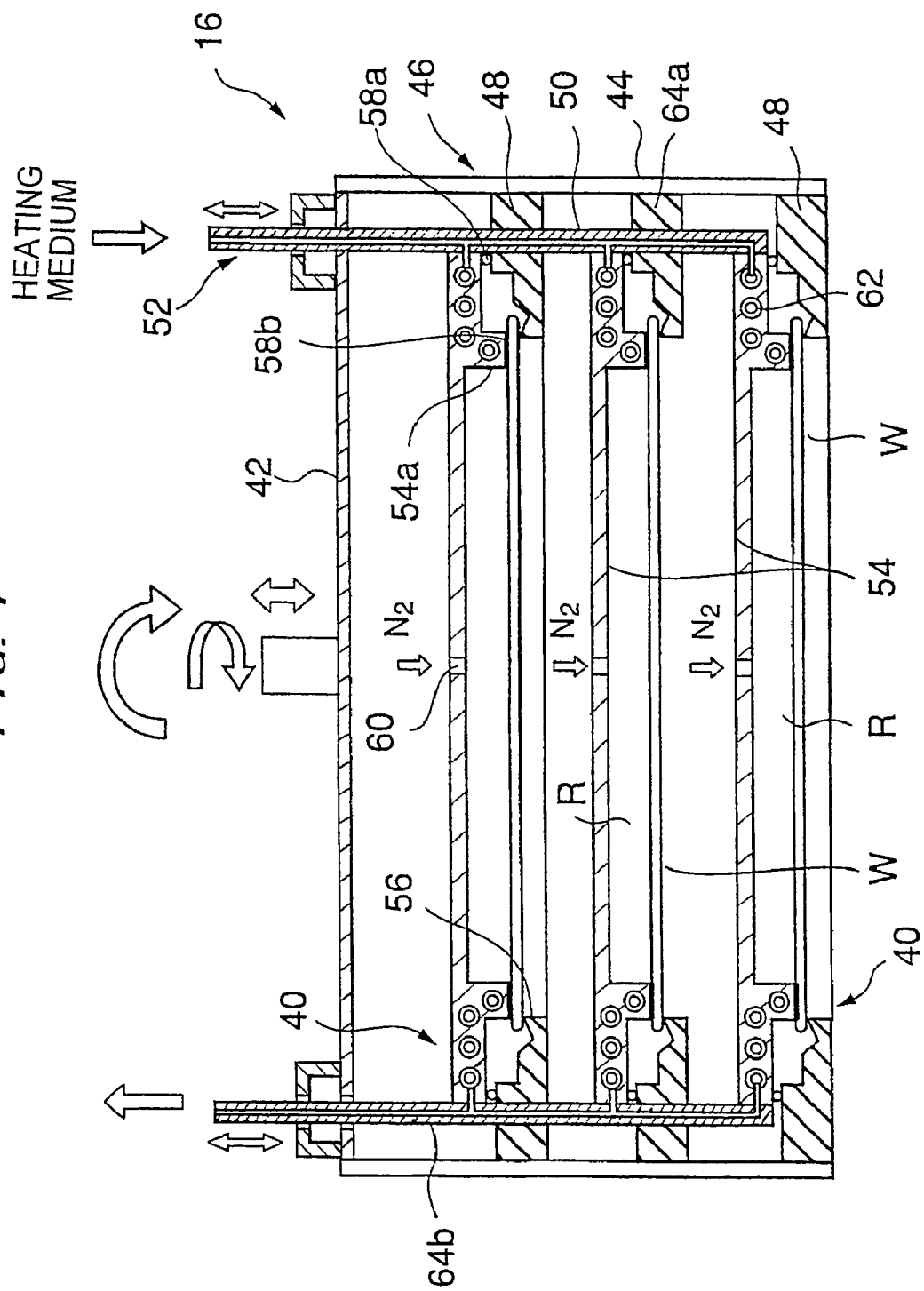
FIG. 4 is an enlarged view showing another example of a substrate holder.

FIG. 4 shows another example of the substrate holder 16. According to this example, the positional relationship between the substrate stage 48 and the substrate presser 54 is reversed, i.e. the substrate presser 54 is positioned above the substrate stage 48. Further, the substrate stage 48 and the substrate presser 54 are each disposed upside down. Thus, the substrate W is to be held with its front surface (plating surface) facing downward (face down).

Specifically, according to this example, when the respective substrate pressers 54 are in a raised position relative to the respective substrate stages 48, the substrates W are dropped onto the upper surfaces of the substrate stages 48 to place the substrates on them, and the respective substrate pressers 54 are then lowered relative to the respective substrate stages 48 so as to hold the plurality of substrates W all together. The details of the substrate presser 54 and the substrate stage 48 are the same as those shown in FIG. 3, hence a description thereof is omitted.

Though the above-described embodiments relate to application to an electroless plating apparatus, the present invention is of course applicable to an electroplating apparatus in which a plating current is passed between an anode and a cathode, bath immersed in a plating solution, to form a plated film. Further, instead of the circulation tube 62 as a heating medium flow passage, it is possible to form a heating medium flow passage by, for example, coupling grooves, etc. which are formed facing each other.

Figure 5:
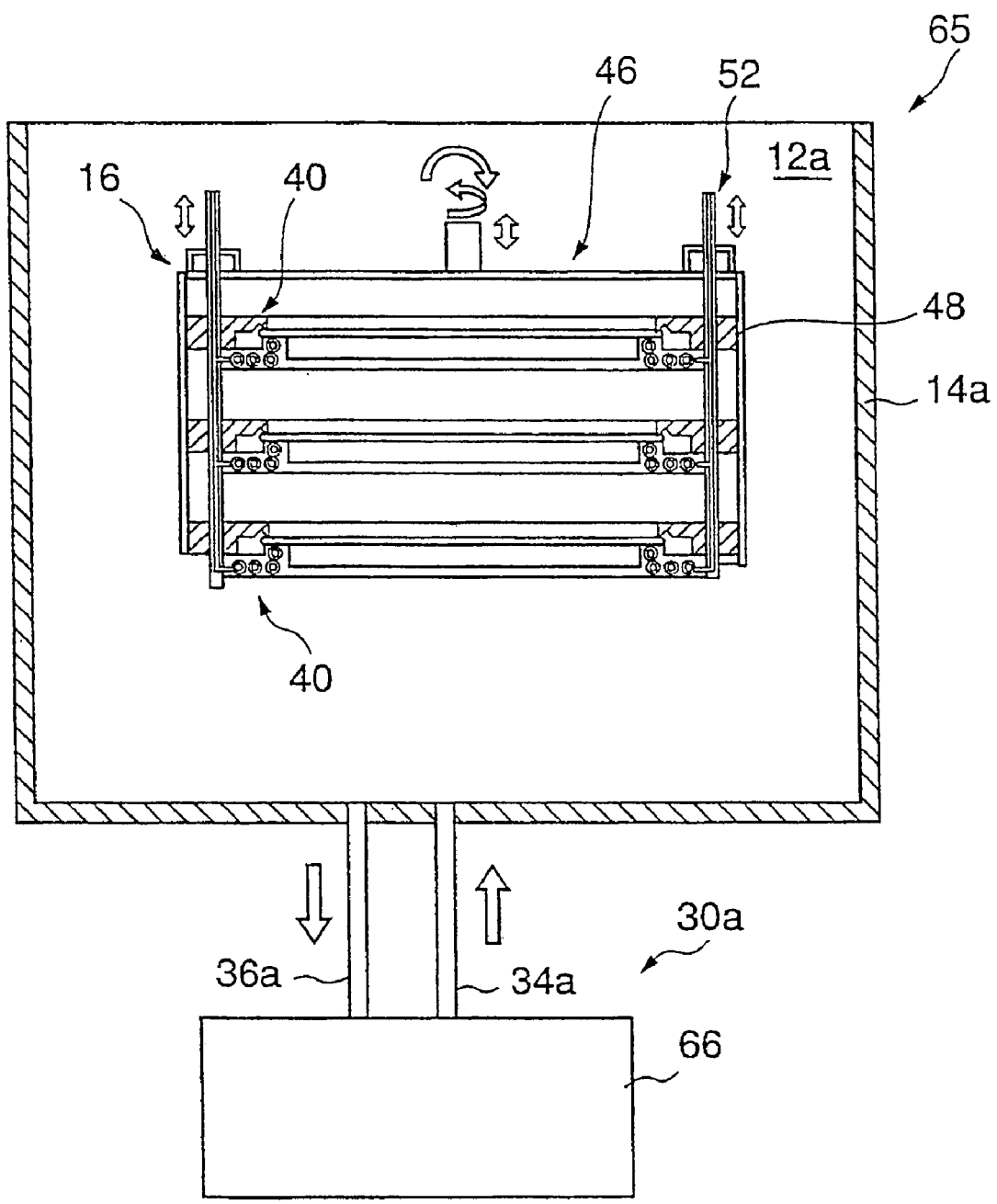
FIG. 5 is a cross-sectional view showing a substrate processing apparatus applied to a pre-plating processing apparatus according to another embodiment of the present invention.

FIG. 5 shows a substrate processing apparatus according to another embodiment of the present invention that is utilized as a pre-plating processing apparatus. According to the pre-plating processing apparatus (substrate processing apparatus) 65, instead of the plating bath 14 of the electroless plating apparatus 10 of FIGS. 2 and 3, a processing bath 14a for holding a pre-plating processing liquid 12a is employed. The processing bath 14a communicates with a processing liquid circulation tank 66 via a discharge pipe 34a and a suction pipe 36a, constituting a processing liquid circulation system 30a. As with the apparatus of FIG. 5, in the interior of the substrate presser 54 of the substrate holder 16 is provided with the circulation tube 62 for passing therethrough a heating medium at a controlled temperature to regulate the temperature of the substrate holding portion 40. The other construction is the same as shown in FIGS. 2 and 3, hence its description is omitted.

According to the substrate processing apparatus of this embodiment, the temperature of the substrate holding portions 40, which have a large volume for holding a plurality of substrates and hence have a large heat capacity, can be regulated to the temperature of a pre-plating processing liquid 12a. Thus, the temperature of the substrate holder 16 with the plurality of substrates W held in the substrate holding portions 40 can be regulated to the temperature of the pre-plating processing liquid 12a in the processing bath 14a before immersing the substrate holder 16 in the pre-plating processing liquid 12a. This makes it possible to process the plurality of substrates W simultaneously while preventing a change of the temperature of the pre-plating processing liquid 12a upon immersion of the substrate holder 16.

Instead of holding the pre-plating processing 12a in the processing bath 14a, it is possible to hold e.g. a cleaning liquid in the processing bath 14a. Thus, the substrate processing apparatus can be utilized also as a cleaning apparatus (post-plating cleaning apparatus) that employs the batch processing method of processing a plurality of substrates simultaneously.

Figure 6:
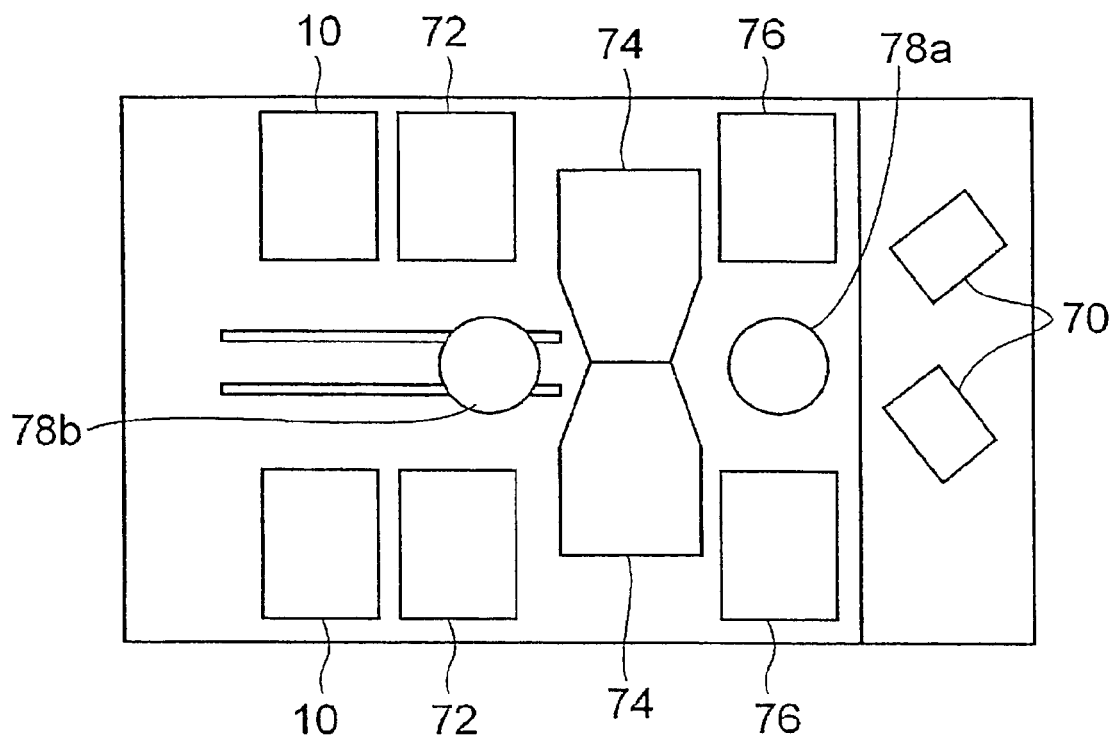
FIG. 6 is a plan view showing the layout of a plating treatment apparatus which is provided with the electroless plating apparatus shown in FIGS. 2 and 3.

FIG. 6 shows the general construction of a plating treatment apparatus which is provided with the electroless plating apparatus 10 and carries out a series of plating treatments. The plating treatment apparatus includes pairs of electroless plating apparatuses 10, loading/unloading sections 70, pre-plating treatment apparatuses 72 for carrying out a pre-plating treatment, such as a catalyst-imparting treatment to impart e.g. a Pd catalyst to a surface of a substrate or an oxide film-removing treatment to remove an oxide film adhering to the exposed surface of interconnects, temporary storage sections 74 capable of carrying out a rough cleaning, and post-cleaning apparatuses 76. The plating treatment apparatus is also provided with a first transfer device 78a for transferring a substrate W between the loading/unloading sections 70, the post-cleaning apparatuses 76 and the temporary storage sections 74, and a second transfer device 78b for transferring the substrate W between the electroless plating apparatuses 10, the pre-plating treatment apparatuses 72 and the temporary storage sections 74.

A description will now be given of a series of plating treatment process steps performed by the above-described plating treatment apparatus. First, a substrate W held in the loading/unloading section 70 is taken out by the first transfer device 78a, and the substrate is placed in the temporary storage section 74. The second transfer device 78b transfers the substrate W to the pre-plating treatment apparatus 72, where the substrate is subjected to a pre-plating treatment, such as a catalyst-imparting treatment using e.g. a $PdCl_2$ solution or an oxide film-removing treatment for removing an oxide film adhering to the exposed surface of interconnects, and the treated substrate W is then rinsed.

Thereafter, the second transfer device 78b transfers the substrate W to the electroless plating apparatus 10, where an electroless plating treatment is carried out using a predetermined plating solution having a predetermined reducing agent. Next, the second transfer device 78b takes the plated substrate out of the electroless plating apparatus 10 and carries the substrate to the temporary storage section 74. Rough cleaning of the substrate is carried out in the temporary storage section 74. Thereafter, the first transfer device 78 carries the substrate to the post-cleaning apparatus 76, where a finish cleaning e.g. by a pencil sponge and spin-drying of the substrate are carried out. After the cleaning, the first transfer robot 78a returns the substrate to the loading/unloading section 70. The substrate is later sent, for example, to a plating apparatus or to an oxide film-forming apparatus.

Figure 7:
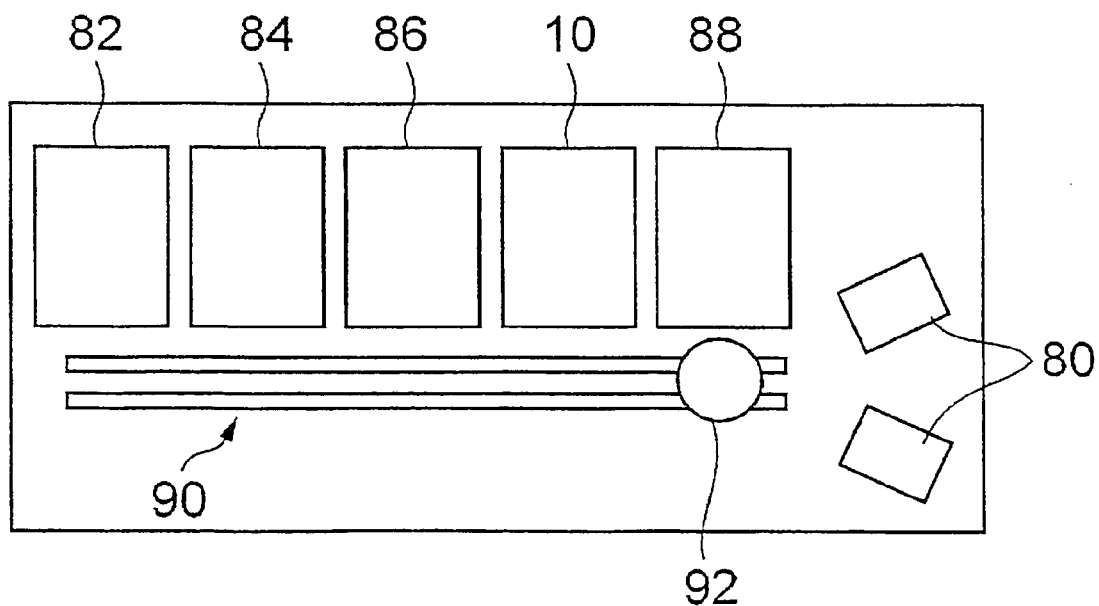
FIG. 7 is a plan view showing the layout of another plating treatment apparatus which is provided with the electroless plating apparatus shown in FIGS. 2 and 3.

FIG. 7 shows the general construction of a plating treatment apparatus which performs a series of plating treatments (cap plating treatments) for forming the protective layer 9 shown in FIG. 1D. The plating treatment apparatus includes a pair of loading/unloading sections 80, a pretreatment section 82, a Pd-imparting treatment section 84, a pre-plating treatment section 86, the electroless plating apparatus 10 and a cleaning/drying treatment section 88. The plating treatment apparatus is also provided with a transfer device 92 which can move along a transfer route 90 and transfers a substrate between the sections and apparatus.

A series of plating treatment (cap plating treatment) process steps as performed by this plating treatment apparatus will now be described. First, a substrate W held in the loading/unloading section 80 is taken out by the transfer device 92 and transferred to the pretreatment section 82, where a pretreatment of the substrate, e.g. re-cleaning of the surface of the substrate, is carried out. The cleaned substrate is transferred to the Pd-imparting treatment section 84, where Pd is adhered to the surface of copper film 7 (see FIG. 1C) to activate the exposed surface of copper film 7. Thereafter, the substrate is transferred to the pre-plating treatment section 86, where a pre-plating treatment, such as a neutralization treatment, is carried out to the substrate. Next, the substrate is transferred to the electroless plating apparatus 10, where a selective electroless plating e.g. of a Co—W—P alloy is carried out onto the activated surface of copper film 7, thereby forming a Co—W—P film (protective layer) 9 on the exposed surface of copper film 7 to protect the exposed surface, as shown in FIG. 1D. A plating solution containing a cobalt salt and a tungsten salt and, as additives, a reducing agent, a complexing agent, a pH buffer and a pH adjusting agent, for example, may be used as an electroless plating solution in the electroless plating.

Alternatively, an electroless Ni—B plating may be carried out onto the exposed surface (after polishing) of the substrate to selectively form a protective layer (plated film) 9 composed of a Ni—B alloy film on the exposed surface of interconnects 8 to protect the interconnects 8. The thickness of the protective layer 9 is generally 0.1 to 500 nm, preferably 1 to 200 nm, more preferably 10 to 100 nm.

As an electroless Ni—B plating solution for forming the protection layer 9 of the Ni—B alloy film, a solution which contains nickel ions, a complexing agent for nickel ions and an alkylamine borane or a borohydride compound as a reducing agent for nickel ions, and which is adjusted to a pH of 5–12 by using TMAH (tetramethylammonium hydroxide) may be used.

Next, the substrate W after the cap plating treatment is transferred to the cleaning/drying treatment section 88 to carry out a cleaning/drying treatment of the substrate, and the cleaned substrate W is returned by the transfer device 92 to a cassette in the loading/unloading section 80.

Though this embodiment shows, as a cap plating treatment, the case of previously activating the exposed surface of copper film 7 by adhering Pd thereto, and then carrying out an electroless Co—W—P plating to selectively cover the activated copper surface with a Co—W—P alloy film, the present invention, of course, is not limited to such an embodiment.

In the above-described embodiments, the plurality of substrates are held horizontally and in parallel in a vertical arrangement. It is, however, possible to hold a plurality of substrates vertically and in parallel in a horizontal arrangement.

According to the present invention, as described hereinabove, a plurality of the substrates held in the substrate holding portions can be processed simultaneously while preventing a change of the temperature of a processing liquid upon immersion therein of the substrate holding portions having a large heat capacity. The present invention thus employs the so-called batch processing method of processing a plurality of substrates simultaneously, thereby increasing the throughput, and can simplify the apparatus and carry out processing, such as electroless plating, stably and securely.

Figure 8:
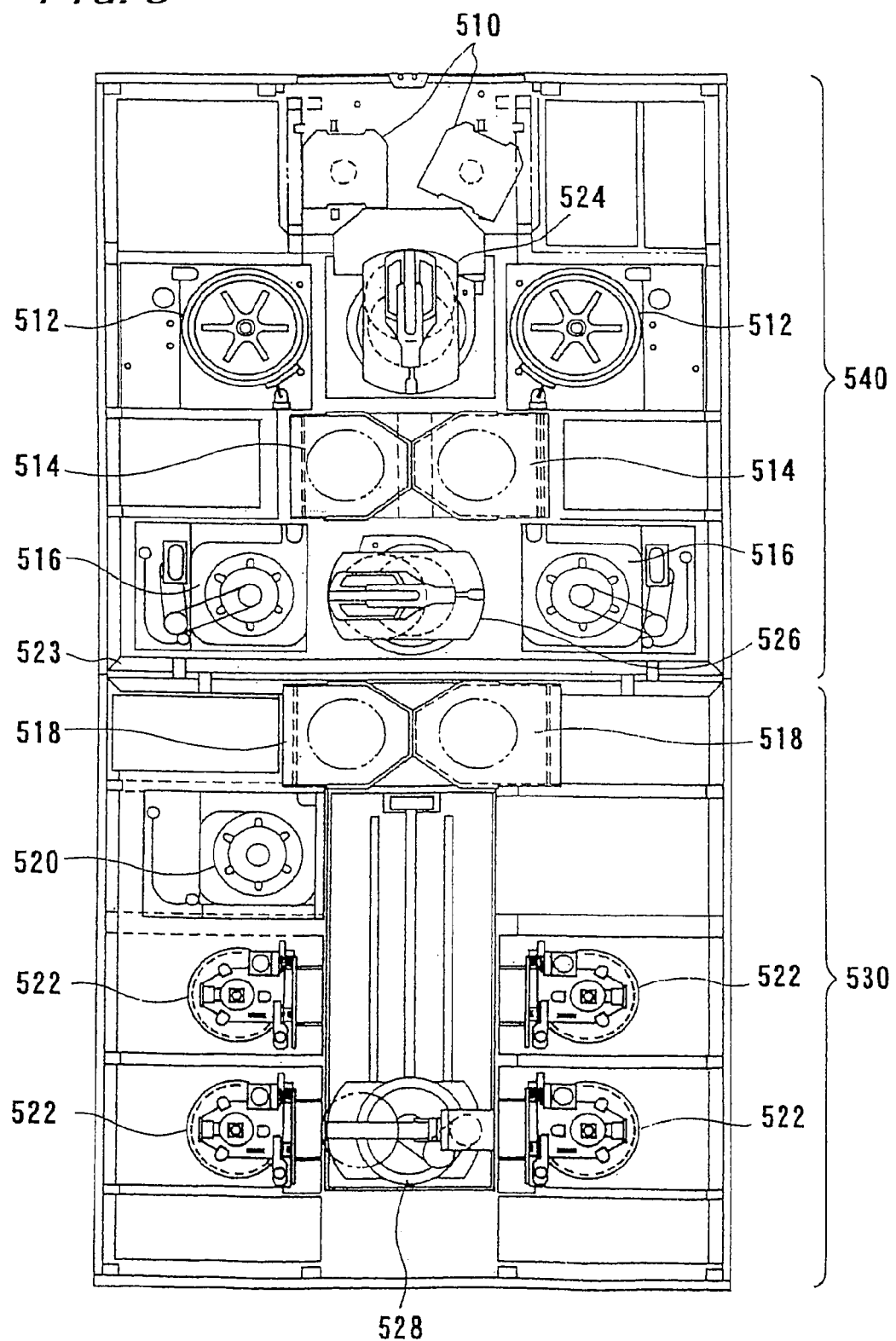
FIG. 8 is a plan view of an example of a substrate plating apparatus.

FIG. 8 is a plan view of an example of a substrate plating apparatus. The substrate plating apparatus comprises loading/unloading sections 510, each pair of cleaning/drying sections 512, first substrate stages 514, bevel-etching/chemical cleaning sections 516 and second substrate stages 518, a washing section 520 provided with a mechanism for reversing the substrate through 180°, and four plating apparatuses 522. The plating substrate apparatus is also provided with a first transferring device 524 for transferring a substrate between the loading/unloading sections 510, the cleaning/drying sections 512 and the first substrate stages 514, a second transferring device 526 for transferring a substrate between the first substrate stages 514, the bevel-etching/chemical cleaning sections 516 and the second substrate stages 518, and a third transferring device 528 for transferring the substrate between the second substrate stages 518, the washing section 520 and the plating apparatuses 522.

The substrate plating apparatus has a partition wall 523 for dividing the plating apparatus into a plating space 530 and a clean space 540. Air can individually be supplied into and exhausted from each of the plating space 530 and the clean space 540. The partition wall 523 has a shutter (not shown) capable of opening and closing. The pressure of the clean space 540 is lower than the atmospheric pressure and higher than the pressure of the plating space 530. This can prevent the air in the clean space 540 from flowing out of the plating apparatus and can prevent the air in the plating space 530 from flowing into the clean space 540.

Figure 9:
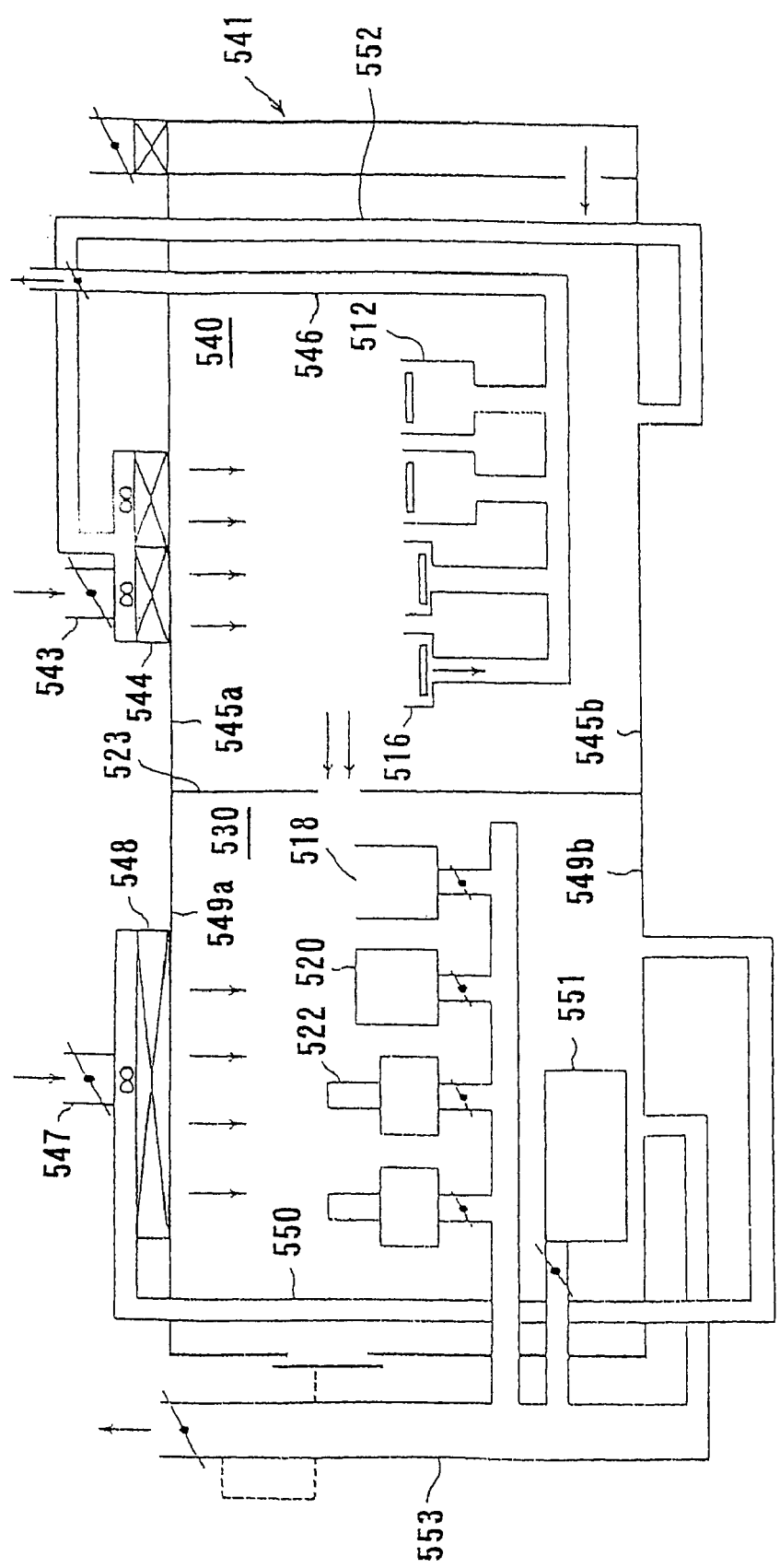
FIG. 9 is a schematic view showing airflow in the substrate plating apparatus shown in FIG. 8.

FIG. 9 is a schematic view showing an air current in the plating substrate apparatus. In the clean space 540, a fresh external air is introduced through a pipe 543 and pushed into the clean space 540 through a high-performance filter 544 by a fan. Hence, a down-flow clean air is supplied from a ceiling 545a to positions around the cleaning/drying sections 512 and the bevel-etching/chemical cleaning sections 516. A large part of the supplied clean air is returned from a floor 545b through a circulation pipe 552 to the ceiling 545a, and pushed again into the clean space 540 through the high-performance filter 544 by the fan, to thus circulate in the clean space 540. A part of the air is discharged from the cleaning/drying sections 512 and the bevel-etching/chemical cleaning sections 516 through a pipe 546 to the exterior, so that the pressure of the clean space 540 is set to be lower than the atmospheric pressure.

The plating space 530 having the washing sections 520 and the plating apparatuses 522 therein is not a clean space (but a contamination zone). However, it is not acceptable to attach particles to the surface of the substrate. Therefore, in the plating space 530, a fresh external air is introduced through a pipe 547, and a down-flow clean air is pushed into the plating space 530 through a high-performance filter 548 by a fan, for thereby preventing particles from being attached to the surface of the substrate. However, if the whole flow rate of the down-flow clean air is supplied by only an external air supply and exhaust, then enormous air supply and exhaust are required. Therefore, the air is discharged through a pipe 553 to the exterior, and a large part of the down-flow is supplied by a circulating air through a circulation pipe 550 extended from a floor 549b, in such a state that the pressure of the plating space 530 is maintained to be lower than the pressure of the clean space 540.

Thus, the air returned to a ceiling 549a through the circulation pipe 550 is pushed again into the plating space 530 through the high-performance filter 548 by the fan. Hence, a clean air is supplied into the plating space 530 to thus circulate in the plating space 530. In this case, air containing chemical mist or gas emitted from the washing sections 520, the plating sections 522, the third transferring device 528, and a plating solution regulating bath 551 is discharged through the pipe 553 to the exterior. Thus, the pressure of the plating space 530 is controlled so as to be lower than the pressure of the clean space 540.

Figure 10:
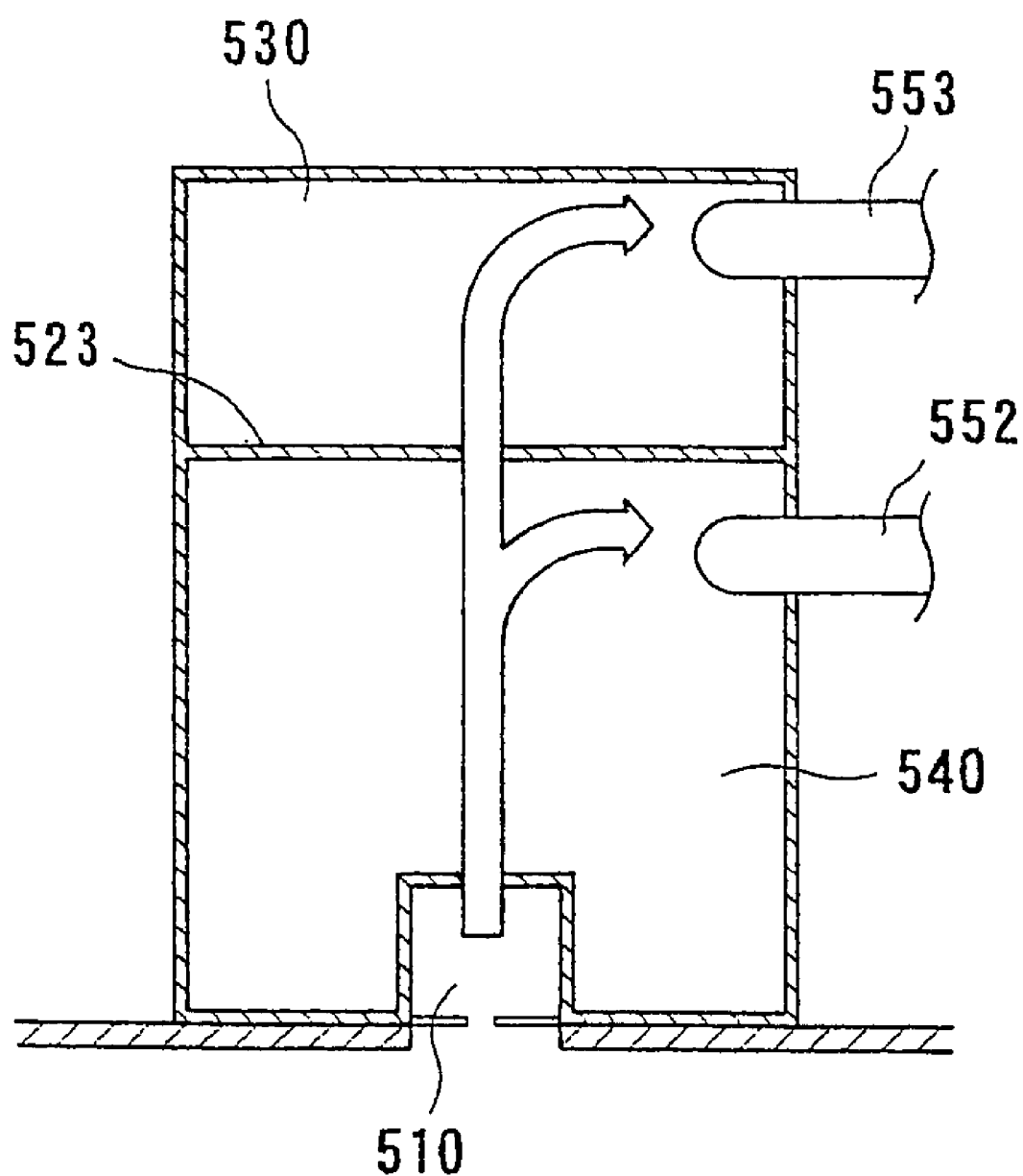
FIG. 10 is a cross-sectional view showing airflows among areas in the substrate plating apparatus shown in FIG. 8.

The pressure in the loading/unloading sections 510 is higher than the pressure in the clean space 540 which is higher than the pressure in the plating space 530. When the shutters (not shown) are opened, therefore, air flows successively through the loading/unloading sections 510, the clean space 540, and the plating space 530, as shown in FIG. 10. Air discharged from the clean space 540 and the plating space 530 flows through the ducts 552, 553 into a common duct 554 (see FIG. 11) which extends out of the clean room.

Figure 11:
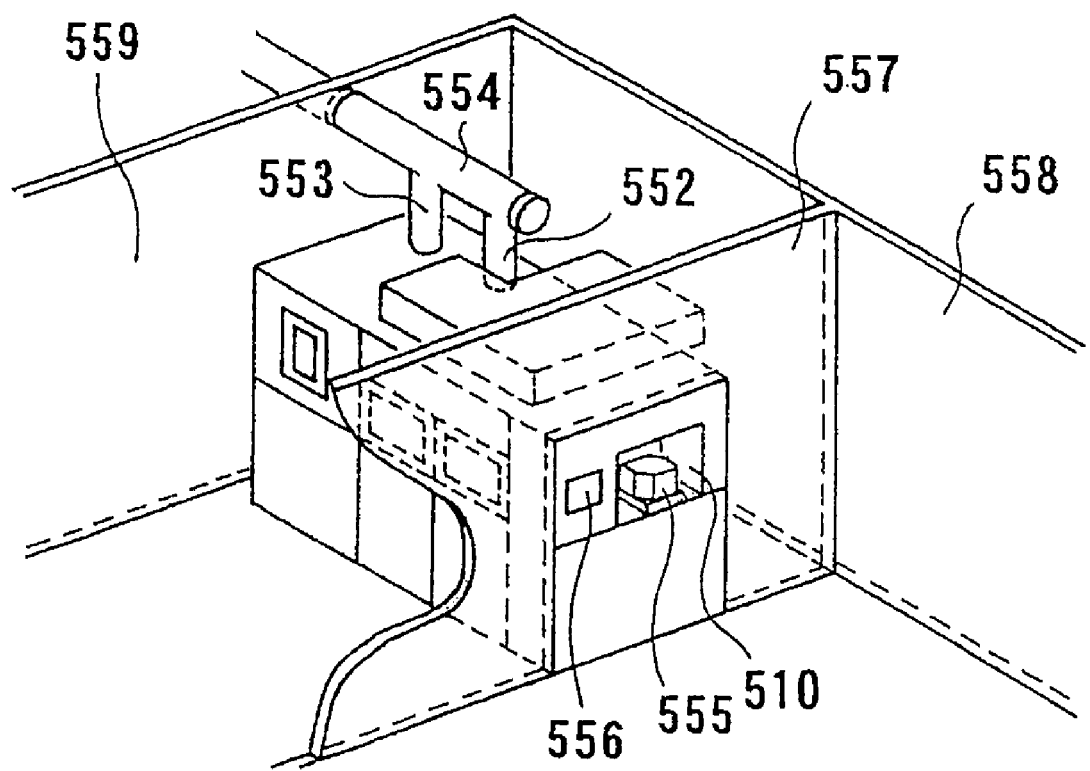
FIG. 11 is a perspective view of the substrate plating apparatus shown in FIG. 8, which is placed in a clean room.

FIG. 11 shows in perspective the substrate plating apparatus shown in FIG. 8, which is placed in the clean room. The loading/unloading sections 510 includes a side wall which has a cassette transfer port 555 defined therein and a control panel 556, and which is exposed to a working zone 558 that is compartmented in the clean room by a partition wall 557. The partition wall 557 also compartments a utility zone 559 in the clean room in which the substrate plating apparatus is installed. Other sidewalls of the substrate plating apparatus are exposed to the utility zone 559 whose air cleanness is lower than the air cleanness in the working zone 558.

Figure 12:
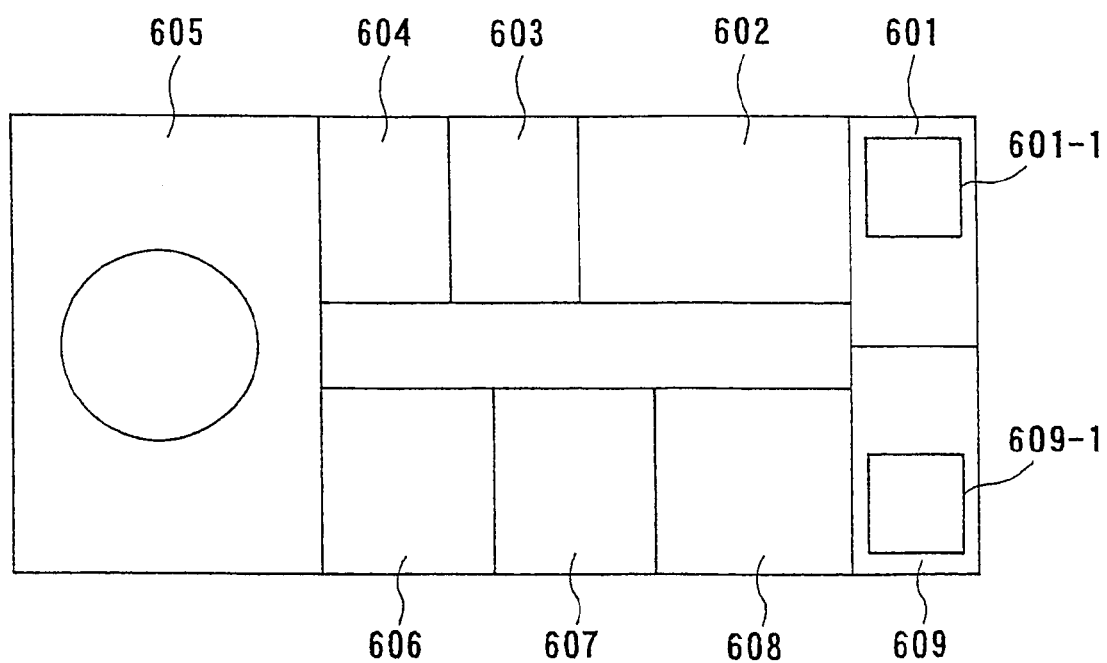
FIG. 12 is a plan view of another example of a substrate plating apparatus.

FIG. 12 is a plan view of another example of a substrate plating apparatus. The substrate plating apparatus shown in FIG. 12 comprises a loading unit 601 for loading a semiconductor substrate, a copper plating chamber 602 for plating a semiconductor substrate with copper, a pair of water cleaning chambers 603, 604 for cleaning a semiconductor substrate with water, a chemical mechanical polishing unit 605 for chemically and mechanically polishing a semiconductor substrate, a pair of water cleaning chambers 606, 607 for cleaning a semiconductor substrate with water, a drying chamber 608 for drying a semiconductor substrate, and an unloading unit 609 for unloading a semiconductor substrate with an interconnection film thereon. The substrate plating apparatus also has a substrate transfer mechanism (not shown) for transferring semiconductor substrates to the chambers 602, 603, 604, the chemical mechanical polishing unit 605, the chambers 606, 607, 608, and the unloading unit 609. The loading unit 601, the chambers 602, 603, 604, the chemical mechanical polishing unit 605, the chambers 606, 607, 608, and the unloading unit 609 are combined into a single unitary arrangement as an apparatus.

The substrate plating apparatus operates as follows: The substrate transfer mechanism transfers a semiconductor substrate W on which an interconnection film has not yet been formed from a substrate cassette 601-1 placed in the loading unit 601 to the copper plating chamber 602. In the copper plating chamber 602, a plated copper film is formed on a surface of the semiconductor substrate W having an interconnection region composed of an interconnection trench and an interconnection hole (contact hole).

After the plated copper film is formed on the semiconductor substrate W in the copper plating chamber 602, the semiconductor substrate W is transferred to one of the water cleaning chambers 603, 604 by the substrate transfer mechanism and cleaned by water in one of the water cleaning chambers 603, 604. The cleaned semiconductor substrate W is transferred to the chemical mechanical polishing unit 605 by the substrate transfer mechanism. The chemical mechanical polishing unit 605 removes the unwanted plated copper film from the surface of the semiconductor substrate W, leaving a portion of the plated copper film in the interconnection trench and the interconnection hole. A barrier layer made of TiN or the like is formed on the surface of the semiconductor substrate W, including the inner surfaces of the interconnection trench and the interconnection hole, before the plated copper film is deposited.

Then, the semiconductor substrate W with the remaining plated copper film is transferred to one of the water cleaning chambers 606, 607 by the substrate transfer mechanism and cleaned by water in one of the water cleaning chambers 606, 607. The cleaned semiconductor substrate W is then dried in the drying chamber 608, after which the dried semiconductor substrate W with the remaining plated copper film serving as an interconnection film is placed into a substrate cassette 609-1 in the unloading unit 609.

Figure 13:
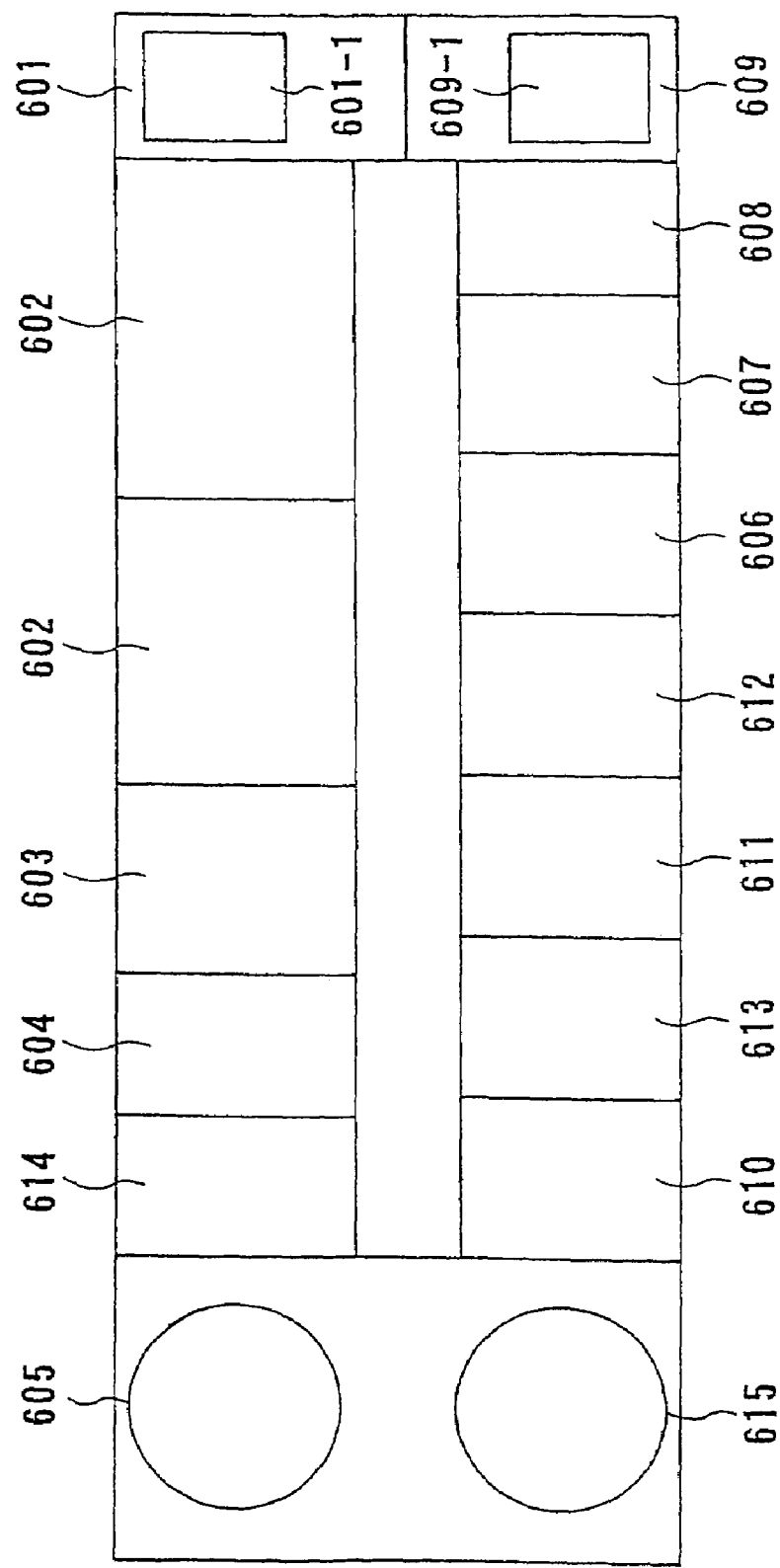
FIG. 13 is a plan view of still another example of a substrate plating apparatus.

FIG. 13 shows a plan view of still another example of a substrate plating apparatus. The substrate plating apparatus shown in FIG. 13 differs from the substrate plating apparatus shown in FIG. 12 in that it additionally includes a copper plating chamber 602, a water cleaning chamber 610, a pretreatment chamber 611, a protective layer plating chamber 612 for forming a protective plated layer on a plated copper film on a semiconductor substrate, water cleaning chambers 613, 614, and a chemical mechanical polishing unit 615. The loading unit 601, the chambers 602, 602, 603, 604, 614, the chemical mechanical polishing units 605, 615, the chambers 606, 607, 608, 610, 611, 612, 613, and the unloading unit 609 are combined into a single unitary arrangement as an apparatus.

The substrate plating apparatus shown in FIG. 13 operates as follows: A semiconductor substrate W is supplied from the substrate cassette 601-1 placed in the loading unit 601 successively to one of the copper plating chambers 602, 602. In one of the copper plating chambers 602, 602, a plated copper film is formed on a surface of a semiconductor substrate W having an interconnection region composed of an interconnection trench and an interconnection hole (contact hole). The two copper plating chambers 602, 602 are employed to allow the semiconductor substrate W to be plated with a copper film for a long period of time. Specifically, the semiconductor substrate W may be plated with a primary copper film according to electroless plating in one of the copper plating chamber 602, and then plated with a secondary copper film according to electroplating in the other copper plating chamber 602. The substrate plating apparatus may have more than two copper plating chambers.

The semiconductor substrate W with the plated copper film formed thereon is cleaned by water in one of the water cleaning chambers 603, 604. Then, the chemical mechanical polishing unit 605 removes the unwanted portion of the plated copper film from the surface of the semiconductor substrate W, leaving a portion of the plated copper film in the interconnection trench and the interconnection hole.

Thereafter, the semiconductor substrate W with the remaining plated copper film is transferred to the water cleaning chamber 610, in which the semiconductor substrate W is cleaned with water. Then, the semiconductor substrate W is transferred to the pretreatment chamber 611, and pretreated therein for the deposition of a protective plated layer. The pretreated semiconductor substrate W is transferred to the protective layer-plating chamber 612. In the protective layer plating chamber 612, a protective plated layer is formed on the plated copper film in the interconnection region on the semiconductor substrate W. For example, the protective plated layer is formed with an alloy of nickel (Ni) and boron (B) by electroless plating.

After semiconductor substrate is cleaned in one of the water cleaning chambers 613, 614, an upper portion of the protective plated layer deposited on the plated copper film is polished off to planarize the protective plated layer, in the chemical mechanical polishing unit 615, After the protective plated layer is polished, the semiconductor substrate W is cleaned by water in one of the water cleaning chambers 606, 607, dried in the drying chamber 608, and then transferred to the substrate cassette 609-1 in the unloading unit 609.

Figure 14:
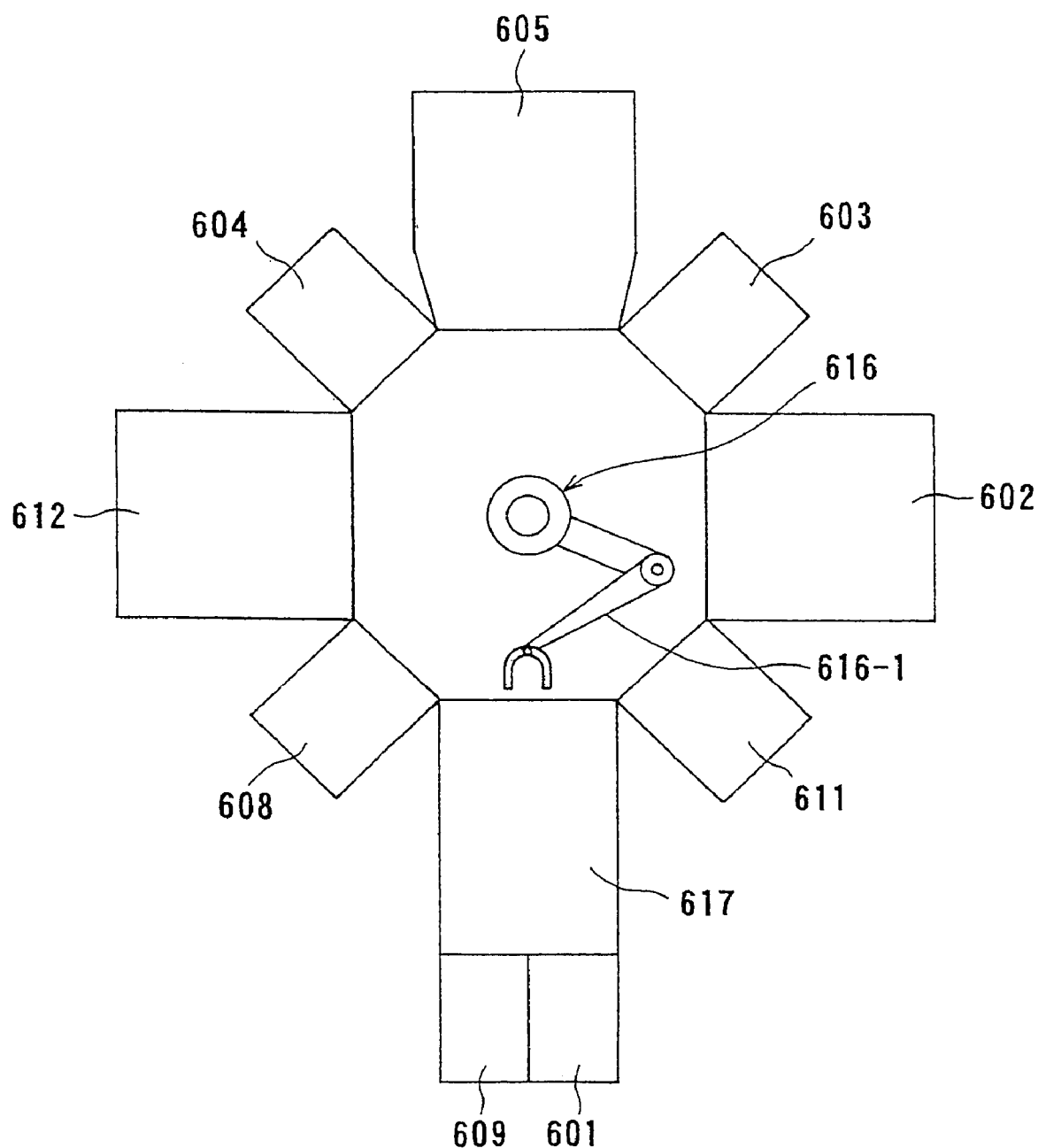
FIG. 14 is a plan view of still another example of a substrate plating apparatus.

FIG. 14 is a plan view of still another example of a substrate plating apparatus. As shown in FIG. 14, the substrate plating apparatus includes a robot 616 at its center which has a robot arm 616-1, and also has a copper plating chamber 602, a pair of water cleaning chambers 603, 604, a chemical mechanical polishing unit 605, a pretreatment chamber 611, a protective layer plating chamber 612, a drying chamber 608, and a loading/unloading station 617 which are disposed around the robot 616 and positioned within the reach of the robot arm 616-1. A loading unit 601 for loading semiconductor substrates and an unloading unit 609 for unloading semiconductor substrates is disposed adjacent to the loading/unloading station 617. The robot 616, the chambers 602, 603, 604, the chemical mechanical polishing unit 605, the chambers 608, 611, 612, the loading/unloading station 617, the loading unit 601, and the unloading unit 609 are combined into a single unitary arrangement as an apparatus.

The substrate plating apparatus shown in FIG. 14 operates as follows:

A semiconductor substrate to be plated is transferred from the loading unit 601 to the loading/unloading station 617, from which the semiconductor substrate is received by the robot arm 616-1 and transferred thereby to the copper plating chamber 602. In the copper plating chamber 602, a plated copper film is formed on a surface of the semiconductor substrate which has an interconnection region composed of an interconnection trench and an interconnection hole. The semiconductor substrate with the plated copper film formed thereon is transferred by the robot arm 616-1 to the chemical mechanical polishing unit 605. In the chemical mechanical polishing unit 605, the plated copper film is removed from the surface of the semiconductor substrate W, leaving a portion of the plated copper film in the interconnection trench and the interconnection hole.

The semiconductor substrate is then transferred by the robot arm 616-1 to the water-cleaning chamber 604, in which the semiconductor substrate is cleaned by water. Thereafter, the semiconductor substrate is transferred by the robot arm 616-1 to the pretreatment chamber 611, in which the semiconductor substrate is pretreated therein for the deposition of a protective plated layer. The pretreated semiconductor substrate is transferred by the robot arm 616-1 to the protective layer plating chamber 612. In the protective layer plating chamber 612, a protective plated layer is formed on the plated copper film in the interconnection region on the semiconductor substrate W. The semiconductor substrate with the protective plated layer formed thereon is transferred by the robot arm 616-1 to the water cleaning chamber 604, in which the semiconductor substrate is cleaned by water. The cleaned semiconductor substrate is transferred by the robot arm 616-1 to the drying chamber 608, in which the semiconductor substrate is dried. The dried semiconductor substrate is transferred by the robot arm 616-1 to the loading/unloading station 617, from which the plated semiconductor substrate is transferred to the unloading unit 609.

Figure 15:
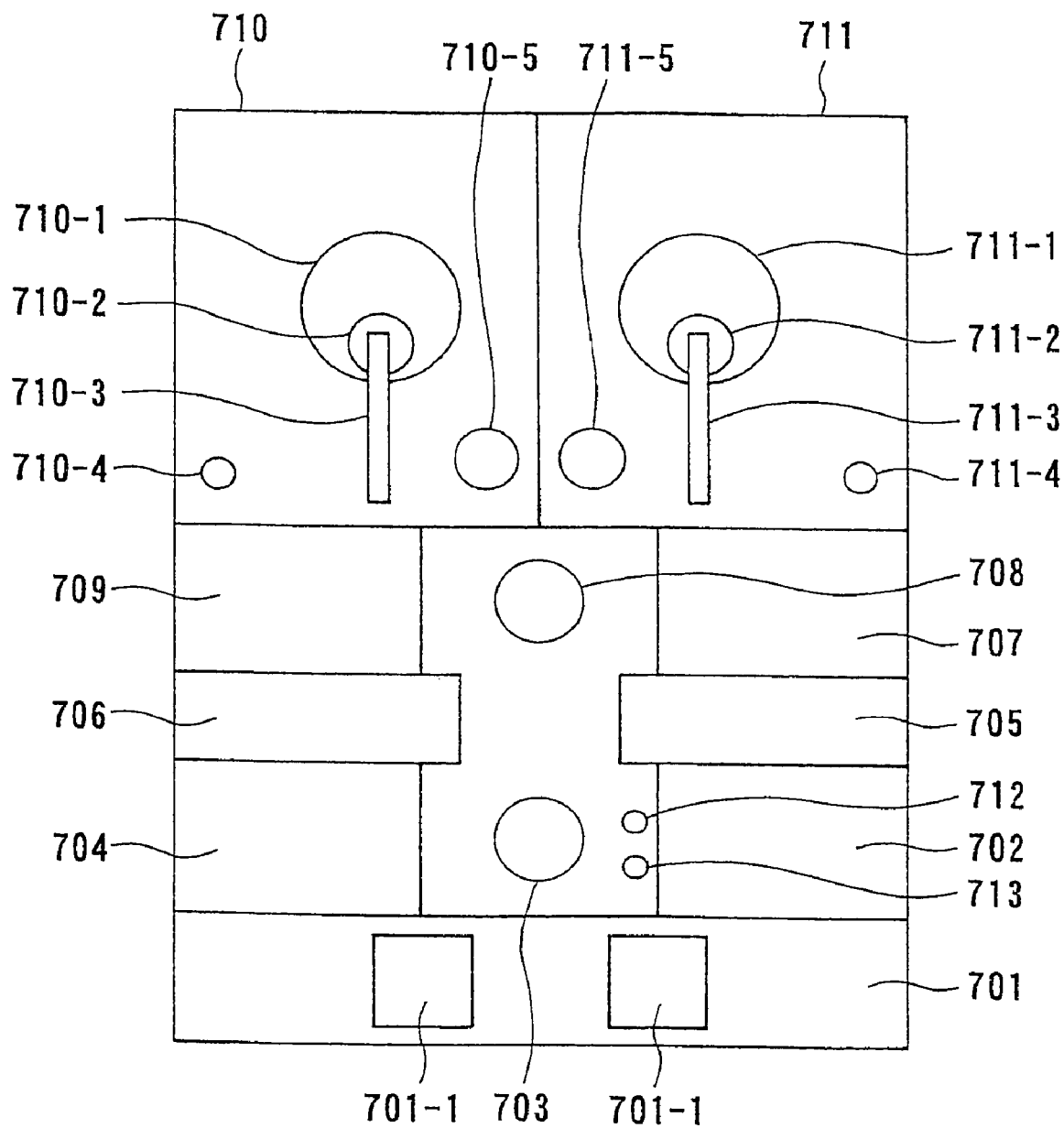
FIG. 15 is a view showing a plan constitution example of the semiconductor substrate processing apparatus.

FIG. 15 is a view showing the plan constitution of another example of a semiconductor substrate processing apparatus. The semiconductor substrate processing apparatus is of a constitution in which there are provided a loading/unloading section 701, a plated Cu film forming unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring the film thicknesses before and after plating, and a dry state film thickness measuring instrument 713 for measuring the film thickness of a semiconductor substrate W in a dry state after polishing are placed near the first robot 703.

The first polishing apparatus (polishing unit) 710 has a polishing table 710-1, a top ring 710-2, a top ring head 710-3, a film thickness measuring instrument 710-4, and a pusher 710-5. The second polishing apparatus (polishing unit) 711 has a polishing table 711-1, atop ring 711-2, atop ring head 711-3, a film thickness measuring instrument 711-4, and a pusher 711-5.

A cassette 701-1 accommodating the semiconductor substrates W, in which a via hole and a trench for interconnect are formed, and a seed layer is formed thereon is placed on a loading port of the loading/unloading section 701. The first robot 703 takes out the semiconductor substrate W from the cassette 701-1, and carries the semiconductor substrate W into the plated Cu film forming unit 702 where a plated Cu film is formed. At this time, the film thickness of the seed layer is measured with the before-plating and after-plating film thickness measuring instrument 712. The plated Cu film is formed by carrying out hydrophilic treatment of the face of the semiconductor substrate W, and then Cu plating. After formation of the plated Cu film, rinsing or cleaning of the semiconductor substrate W is carried out in the plated Cu film forming unit 702.

When the semiconductor substrate W is taken out from the plated Cu film forming unit 702 by the first robot 703, the film thickness of the plated Cu film is measured with the before-plating and after-plating film thickness measuring instrument 712. The results of its measurement are recorded into a recording device (not shown) as record data on the semiconductor substrate, and are used for judgment of an abnormality of the plated Cu film forming unit 702. After measurement of the film thickness, the first robot 703 transfers the semiconductor substrate W to the reversing machine 705, and the reversing machine 705 reverses the semiconductor substrate W (the surface on which the plated Cu film has been formed faces downward). The first polishing apparatus 710 and the second polishing apparatus 711 perform polishing in a serial mode and a parallel mode. Next, polishing in the serial mode will be described.

In the serial mode polishing, a primary polishing is performed by the polishing apparatus 710, and a secondary polishing is performed by the polishing apparatus 711. The second robot 708 picks up the semiconductor substrate W on the reversing machine 705, and places the semiconductor substrate W on the pusher 710-5 of the polishing apparatus 710. The top ring 710-2 attracts the semiconductor substrate W on the pusher 710-5 by suction, and brings the surface of the plated Cu film of the semiconductor substrate W into contact with a polishing surface of the polishing table 710-1 under pressure to perform a primary polishing. With the primary polishing, the plated Cu film is basically polished. The polishing surface of the polishing table 710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 710-5 by the top ring 710-2. The second robot 708 picks up the semiconductor substrate W, and introduces it into the first cleaning machine 709. At this time, a chemical liquid may be ejected toward the face and backside of the semiconductor substrate W on the pusher 710-5 to remove particles therefrom or cause particles to be difficult to adhere thereto.

After completion of cleaning in the first cleaning machine 709, the second robot 708 picks up the semiconductor substrate W, and places the semiconductor substrate W on the pusher 711-5 of the second polishing apparatus 711. The top ring 711-2 attracts the semiconductor substrate W on the pusher 711-5 by suction, and brings the surface of the semiconductor substrate W, which has the barrier layer formed thereon, into contact with a polishing surface of the polishing table 711-1 under pressure to perform the secondary polishing. The constitution of the polishing table is the same as the top ring 711-2. With this secondary polishing, the barrier layer is polished. However, there may be a case in which a Cu film and an oxide film left after the primary polishing are also polished.

A polishing surface of the polishing table 711-1 is composed of foamed polyurethane such as IC1000, or a material having abrasive grains fixed thereto or impregnated therein. Upon relative movements of the polishing surface and the semiconductor substrate W, polishing is carried out. At this time, silica, alumina, ceria, or the like is used as abrasive grains or slurry. A chemical liquid is adjusted depending on the type of the film to be polished.

Detection of an end point of the secondary polishing is performed by measuring the film thickness of the barrier layer mainly with the use of the optical film thickness measuring instrument, and detecting the film thickness which has become zero, or the surface of an insulating film comprising $SiO_2$ shows up. Furthermore, a film thickness measuring instrument with an image processing function is used as the film thickness measuring instrument 711-4 provided near the polishing table 711-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the end point of the secondary polishing is not reached, re-polishing is performed. If over-polishing has been performed beyond a prescribed value due to any abnormality, then the semiconductor substrate processing apparatus is stopped to avoid next polishing so that defective products will not increase.

After completion of the secondary polishing, the semiconductor substrate W is moved to the pusher 711-5 by the top ring 711-2. The second robot 708 picks up the semiconductor substrate W on the pusher 711-5. At this time, a chemical liquid may be ejected toward the face and backside of the semiconductor substrate W on the pusher 711-5 to remove particles therefrom or cause particles to be difficult to adhere thereto.

The second robot 708 carries the semiconductor substrate W into the second cleaning machine 707 where cleaning of the semiconductor substrate W is performed. The constitution of the second cleaning machine 707 is also the same as the constitution of the first cleaning machine 709. The face of the semiconductor substrate W is scrubbed with the PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of the diffused Cu thereon. If there is no problem of diffusion, scrubbing cleaning is performed with the PVA sponge rolls using the same chemical liquid as that used for the face.

After completion of the above cleaning, the second robot 708 picks up the semiconductor substrate W and transfers it to the reversing machine 706, and the reversing machine 706 reverses the semiconductor substrate W. The semiconductor substrate W which has been reversed is picked up by the first robot 703, and transferred to the third cleaning machine 704. In the third cleaning machine 704, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying.

As described above, if the film thickness has been measured with the film thickness measuring instrument 711-4 provided near the polishing table 711-1, then the semiconductor substrate W is not subjected to further process and is accommodated into the cassette placed on the unloading port of the loading/unloading section 701.

Figure 16:
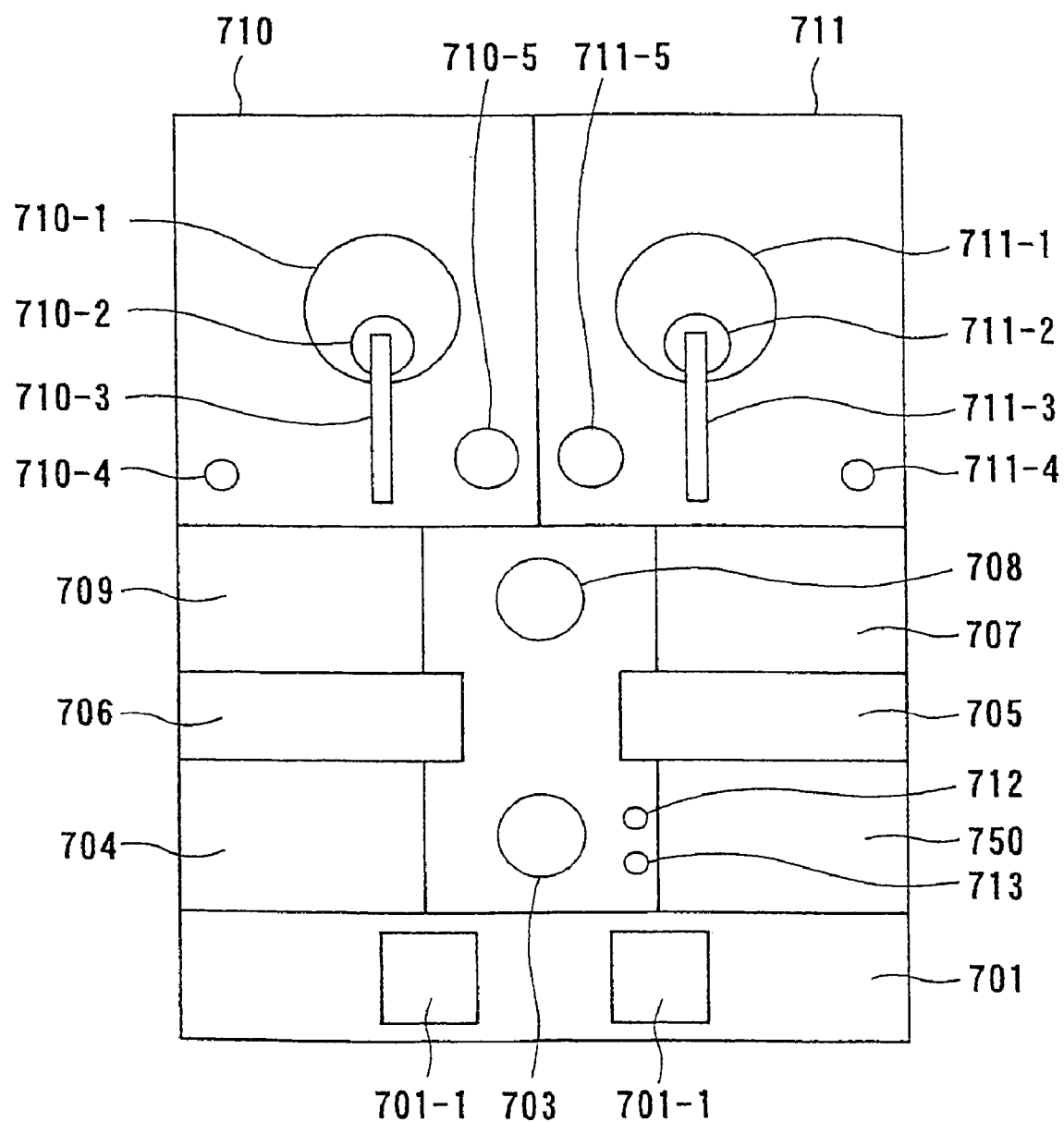
FIG. 16 is a view showing another plan constitution example of the semiconductor substrate processing apparatus.

FIG. 16 is a view showing the plan constitution of another example of a semiconductor substrate processing apparatus. The substrate processing apparatus differs from the substrate processing apparatus shown in FIG. 15 in that a cap plating unit 750 is provided instead of the plated Cu film forming unit 702 in FIG. 15.

A cassette 701-1 accommodating the semiconductor substrates W formed plated Cu film is placed on a load port of a loading/unloading section 701. The semiconductor substrate W taken out from the cassette 701-1 is transferred to the first polishing apparatus 710 or second polishing apparatus 711 in which the surface of the plated Cu film is polished. After completion of polishing of the plated Cu film, the semiconductor substrate W is cleaned in the first cleaning machine 709.

After completion of cleaning in the first cleaning machine 709, the semiconductor substrate W is transferred to the cap plating unit 750 where cap plating is applied onto the surface of the plated Cu film with the aim of preventing oxidation of plated Cu film due to the atmosphere. The semiconductor substrate to which cap plating has been applied is carried by the second robot 708 from the cap plating unit 750 to the second cleaning machine 707 where it is cleaned with pure water or deionized water. The semiconductor substrate after completion of cleaning is returned into the cassette 701-1 placed on the loading/unloading section 701.

Figure 17:
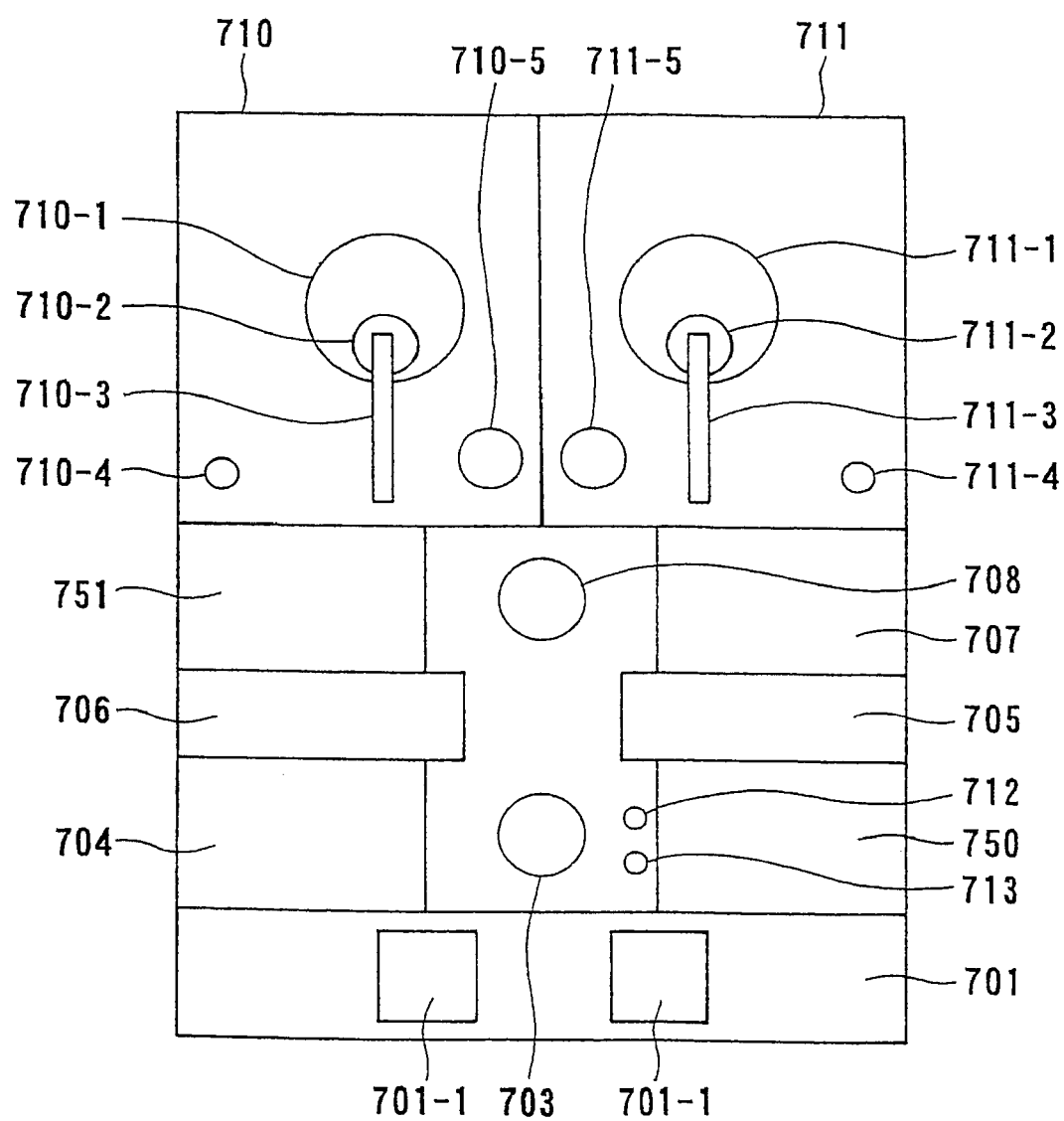
FIG. 17 is a view showing still another plan constitution example of the semiconductor substrate processing apparatus.

FIG. 17 is a view showing the plan constitution of still another example of a semiconductor substrate processing apparatus. The substrate processing apparatus differs from the substrate processing apparatus shown in FIG. 16 in that an annealing unit 751 is provided instead of the first cleaning machine 709 in FIG. 16.

The semiconductor substrate W, which is polished in the polishing unit 710 or 711, and cleaned in the second cleaning machine 707 described above, is transferred to the cap plating unit 750 where cap plating is applied onto the surface of the plated Cu film. The semiconductor substrate to which cap plating has been applied is carried by the second robot 708 from the cap plating unit 750 to the second cleaning machine 707 where it is cleaned.

After completion of cleaning in the second cleaning machine 707, the semiconductor substrate W is transferred to the annealing unit 751 in which the substrate is annealed, whereby the plated Cu film is alloyed so as to increase the electromigration resistance of the plated Cu film. The semiconductor substrate W to which annealing treatment has been applied is carried from the annealing unit 751 to the second cleaning machine 707 where it is cleaned with pure water or deionized water. The semiconductor substrate W after completion of cleaning is returned into the cassette 701-1 placed on the loading/unloading section 701.

Figure 18:
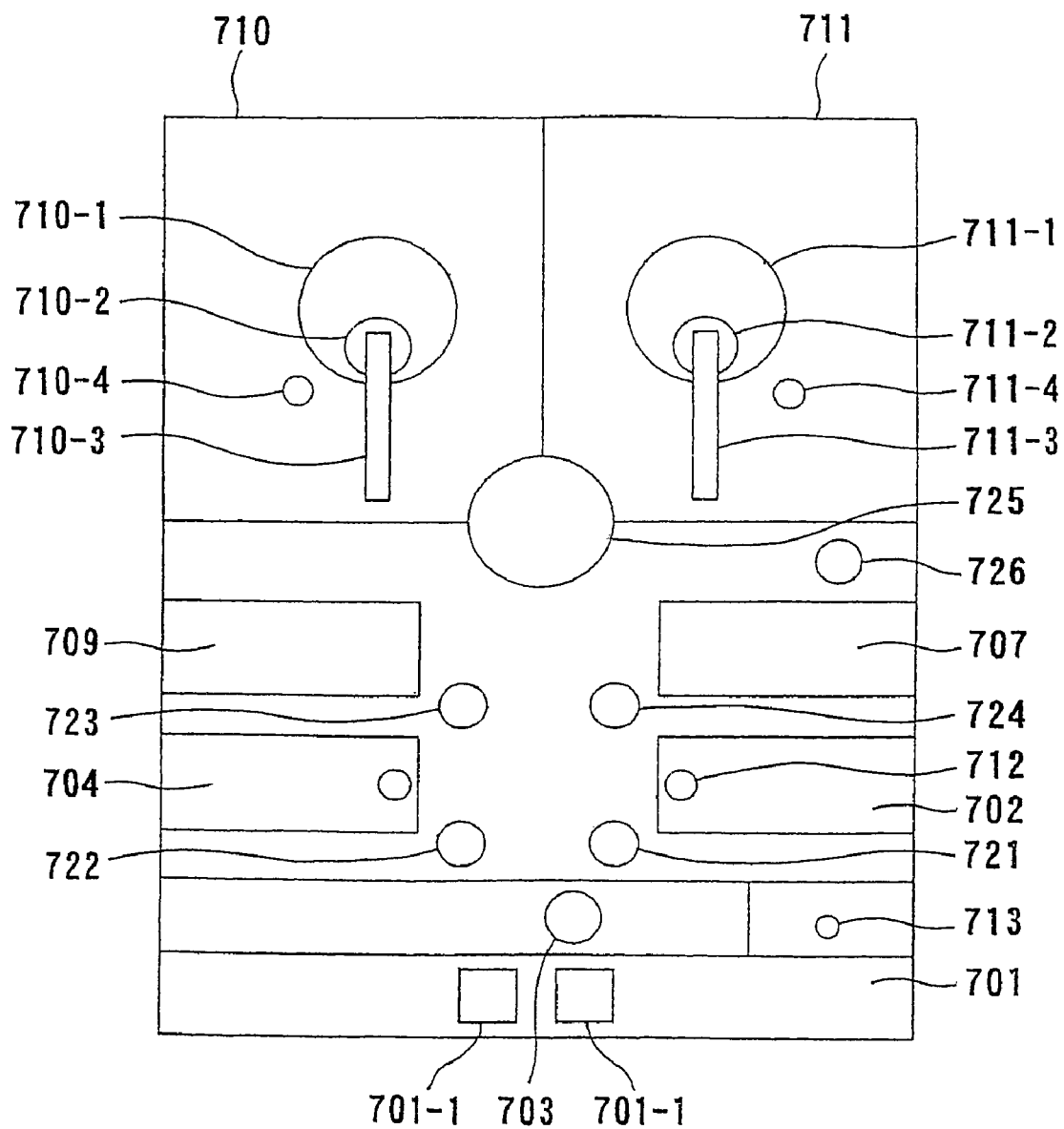
FIG. 18 is a view showing still another plan constitution example of the semiconductor substrate processing apparatus.

FIG. 18 is a view showing a plan layout constitution of another example of the substrate processing apparatus. In FIG. 18, portions denoted by the same reference numerals as those in FIG. 15 show the same or corresponding portions. In the substrate processing apparatus, a pusher indexer 725 is disposed close to a first polishing apparatus 710 and a second polishing apparatus 711. Substrate placing tables 721, 722 are disposed close to a third cleaning machine 704 and a plated Cu film forming unit 702, respectively. A robot 723 is disposed close to a first cleaning machine 709 and the third cleaning machine 704. Further, a robot 724 is disposed close to a second cleaning machine 707 and the plated Cu film forming unit 702, and a dry state film thickness measuring instrument 713 is disposed close to a loading/unloading section 701 and a first robot 703.

In the substrate processing apparatus of the above constitution, the first robot 703 takes out a semiconductor substrate W from a cassette 701-1 placed on the load port of the loading/unloading section 701. After the film thicknesses of a barrier layer and a seed layer are measured with the dry state film thickness measuring instrument 713, the first robot 703 places the semiconductor substrate W on the substrate placing table 721. In the case where the dry state film thickness measuring instrument 713 is provided on the hand of the first robot 703, the film thicknesses are measured thereon, and the substrate is placed on the substrate placing table 721. The second robot 723 transfers the semiconductor substrate W on the substrate placing table 721 to the plated Cu film forming unit 702 in which a plated Cu film is formed. After formation of the plated Cu film, the film thickness of the plated Cu film is measured with a before-plating and after-plating film thickness measuring instrument 712. Then, the second robot 723 transfers the semiconductor substrate W to the pusher indexer 725 and loads it thereon.

[Serial Mode]

In the serial mode, a top ring 710-2 holds the semiconductor substrate W on the pusher indexer 725 by suction, transfers it to a polishing table 710-1, and presses the semiconductor substrate W against a polishing surface on the polishing table 710-1 to perform polishing. Detection of the end point of polishing is performed by the same method as described above. The semiconductor substrate W after completion of polishing is transferred to the pusher indexer 725 by the top ring 710-2, and loaded thereon. The second robot 723 takes out the semiconductor substrate W, and carries it into the first cleaning machine 709 for cleaning. Then, the semiconductor substrate W is transferred to the pusher indexer 725, and loaded thereon.

A top ring 711-2 holds the semiconductor substrate W on the pusher indexer 725 by suction, transfers it to a polishing table 711-1, and presses the semiconductor substrate W against a polishing surface on the polishing table 711-1 to perform polishing. Detection of the end point of polishing is performed by the same method as described above. The semiconductor substrate W after completion of polishing is transferred to the pusher indexer 725 by the top ring 711-2, and loaded thereon. The third robot 724 picks up the semiconductor substrate W, and its film thickness is measured with a film thickness measuring instrument 726. Then, the semiconductor substrate W is carried into the second cleaning machine 707 for cleaning. Thereafter, the semiconductor substrate W is carried into the third cleaning machine 704, where it is cleaned and then dried by spin-drying. Then, the semiconductor substrate W is picked up by the third robot 724, and placed on the substrate placing table 722.

[Parallel Mode]

In the parallel mode, the top ring 710-2 or 711-2 holds the semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of the film thickness, the third robot 724 picks up the semiconductor substrate W, and places it on the substrate placing table 722.

The first robot 703 transfers the semiconductor substrate W on the substrate placing table 722 to the dry state film thickness measuring instrument 713. After the film thickness is measured, the semiconductor substrate W is returned to the cassette 701-1 of the loading/unloading section 701.

Figure 19:
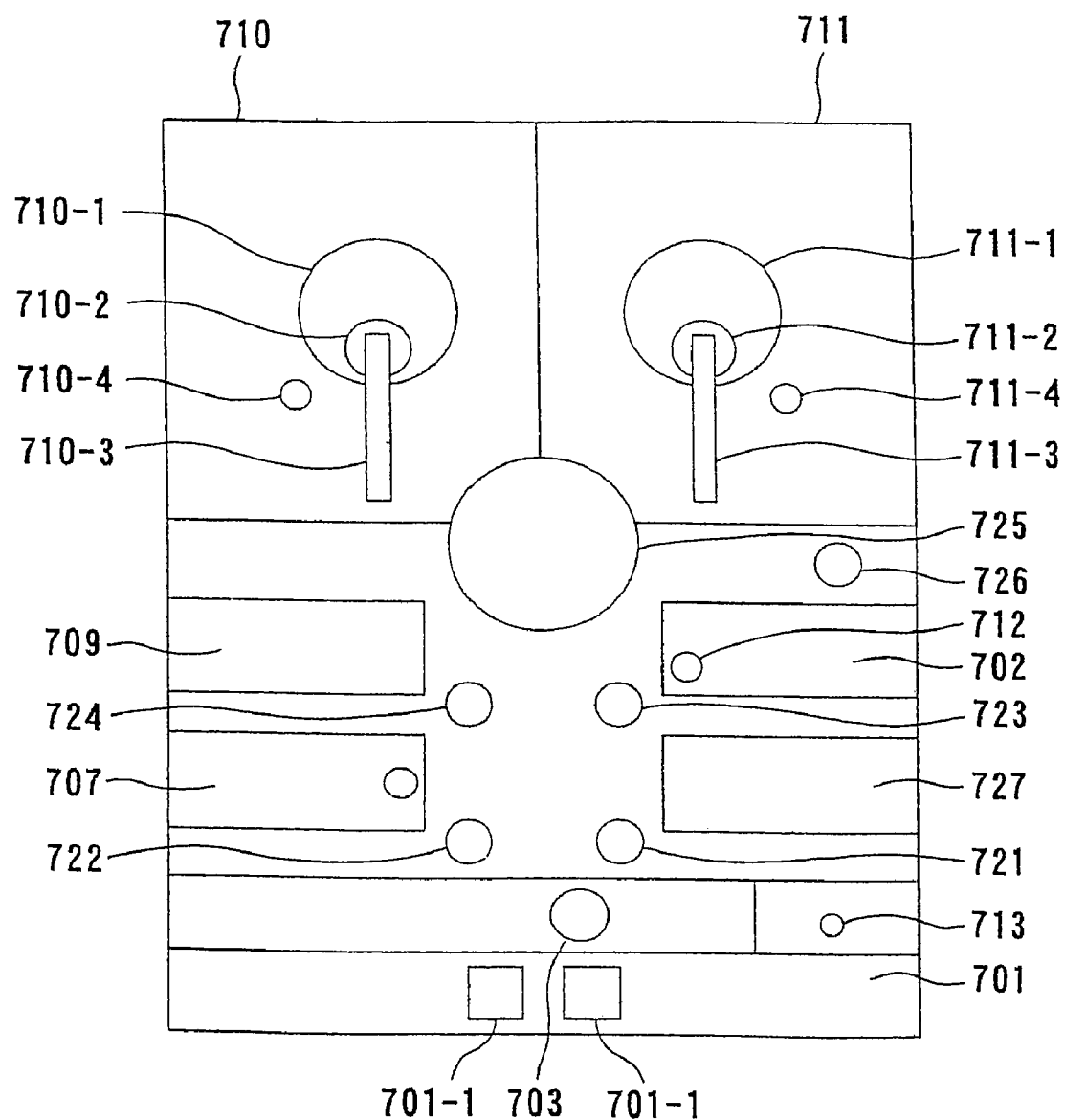
FIG. 19 is a view showing still another plan constitution example of the semiconductor substrate processing apparatus.

FIG. 19 is a view showing another plan layout constitution of the substrate processing apparatus. The substrate processing apparatus is such a substrate processing apparatus which forms a seed layer and a plated Cu film on a semiconductor substrate W having no seed layer formed thereon, and polishes these films to form interconnects.

In the substrate polishing apparatus, a pusher indexer 725 is disposed close to a first polishing apparatus 710 and a second polishing apparatus 711, substrate placing tables 721, 722 are disposed close to a second cleaning machine 707 and a seed layer forming unit 727, respectively, and a robot 723 is disposed close to the seed layer forming unit 727 and a plated Cu film forming unit 702. Further, a robot 724 is disposed close to a first cleaning machine 709 and the second cleaning machine 707, and a dry state film thickness measuring instrument 713 is disposed close to a loading/unloading section 701 and a first robot 703.

The first robot 703 takes out a semiconductor substrate W having a barrier layer thereon from a cassette 701-1 placed on the load port of the loading/unloading section 701, and places it on the substrate placing table 721. Then, the second robot 723 transfers the semiconductor substrate W to the seed layer forming unit 727 where a seed layer is formed. The seed layer is formed by electroless plating. The second robot 723 enables the semiconductor substrate having the seed layer formed thereon to be measured in thickness of the seed layer by the before-plating and after-plating film thickness measuring instrument 712. After measurement of the film thickness, the semiconductor substrate is carried into the plated Cu film forming unit 702 where a plated Cu film is formed.

After formation of the plated Cu film, its film thickness is measured, and the semiconductor substrate is transferred to a pusher indexer 725. A top ring 710-2 or 711-2 holds the semiconductor substrate W on the pusher indexer 725 by suction, and transfers it to a polishing table 710-1 or 711-1 to perform polishing. After polishing, the top ring 710-2 or 711-2 transfers the semiconductor substrate W to a film thickness measuring instrument 710-4 or 711-4 to measure the film thickness. Then, the top ring 710-2 or 711-2 transfers the semiconductor substrate W to the pusher indexer 725, and places it thereon.

Then, the third robot 724 picks up the semiconductor substrate W from the pusher indexer 725, and carries it into the first cleaning machine 709. The third robot 724 picks up the cleaned semiconductor substrate W from the first cleaning machine 709, carries it into the second cleaning machine 707, and places the cleaned and dried semiconductor substrate on the substrate placing table 722. Then, the first robot 703 picks up the semiconductor substrate W, and transfers it to the dry state film thickness measuring instrument 713 in which the film thickness is measured, and the first robot 703 carries it into the cassette 701-1 placed on the unload port of the loading/unloading section 701.

In the substrate processing apparatus shown in FIG. 19, interconnects are formed by forming a barrier layer, a seed layer and a plated Cu film on a semiconductor substrate W having a via hole or a trench of a circuit pattern formed therein, and polishing them.

The cassette 701-1 accommodating the semiconductor substrates W before formation of the barrier layer is placed on the load port of the loading/unloading section 701. The first robot 703 takes out the semiconductor substrate W from the cassette 701-1 placed on the load port of the loading/unloading section 701, and places it on the substrate placing table 721. Then, the second robot 723 transfers the semiconductor substrate W to the seed layer forming unit 727 where a barrier layer and a seed layer are formed. The barrier layer and the seed layer are formed by electroless plating. The second robot 723 brings the semiconductor substrate W having the barrier layer and the seed layer formed thereon to the before-plating and after-plating film thickness measuring instrument 712 which measures the film thicknesses of the barrier layer and the seed layer. After measurement of the film thicknesses, the semiconductor substrate W is carried into the plated Cu film forming unit 702 where a plated Cu film is formed.

Figure 20:
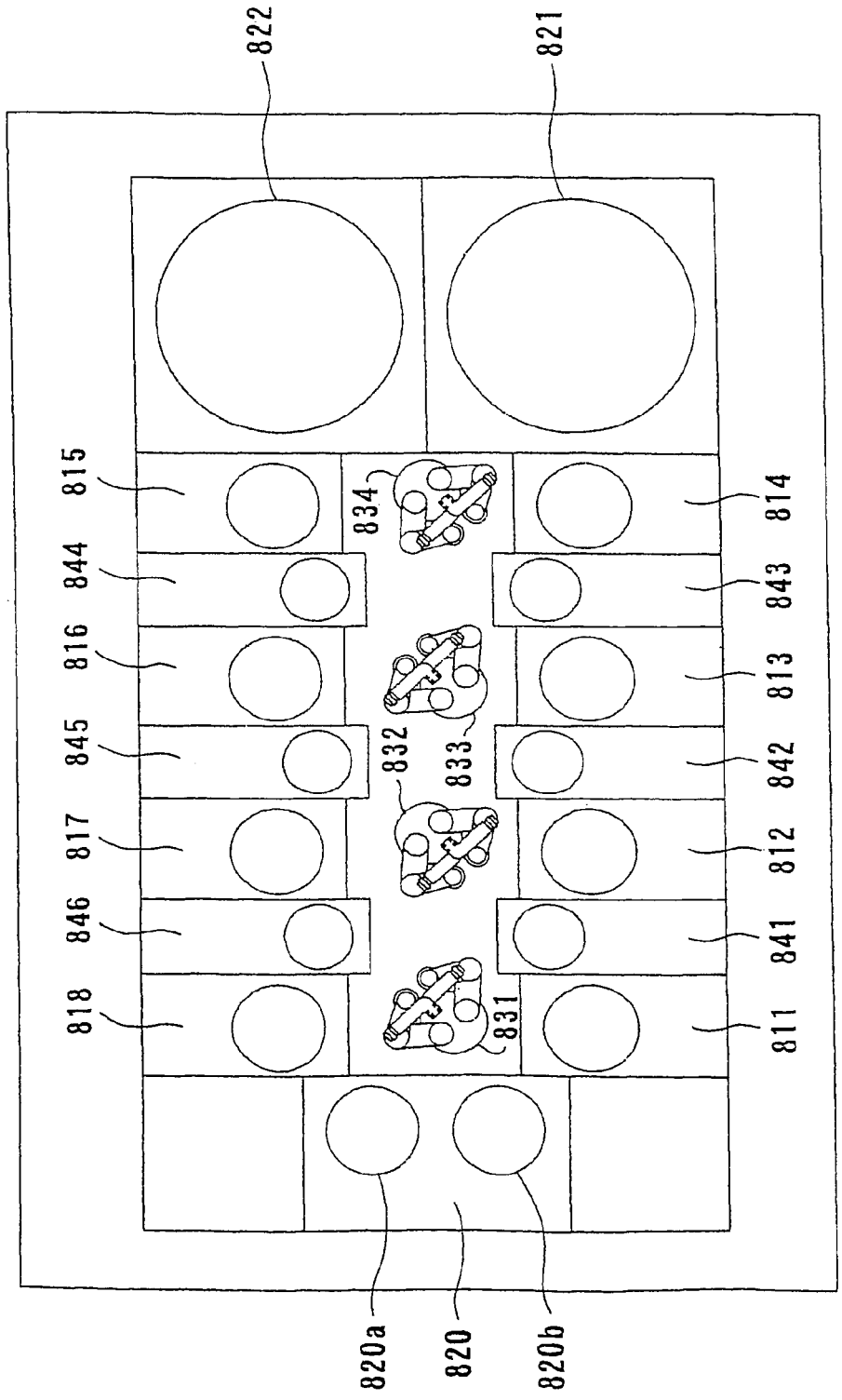
FIG. 20 is a view showing still another plan constitution example of the semiconductor substrate processing apparatus.

FIG. 20 is a view showing plan layout constitution of another example of the substrate processing apparatus. In the substrate processing apparatus, there are provided a barrier layer forming unit 811, a seed layer forming unit 812, a plated film forming unit 813, an annealing unit 814, a first cleaning unit 815, a bevel and backside cleaning unit 816, a cap plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placing table 845, a third film thickness measuring instrument 846, a loading/unloading section 820, a first polishing apparatus 821, a second polishing apparatus 822, a first robot 831, a second robot 832, a third robot 833, and a fourth robot 834. The film thickness measuring instruments 841, 842, and 846 are units, have the same size as the frontage dimension of other units (plating, cleaning, annealing units, and the like), and are thus interchangeable.

In this example, an electroless Co—B plating apparatus can be used as the barrier layer forming unit 811, an electroless Cu plating apparatus as the seed layer forming unit 812, and an electroplating apparatus as the plated film forming unit 813.

Figure 21:
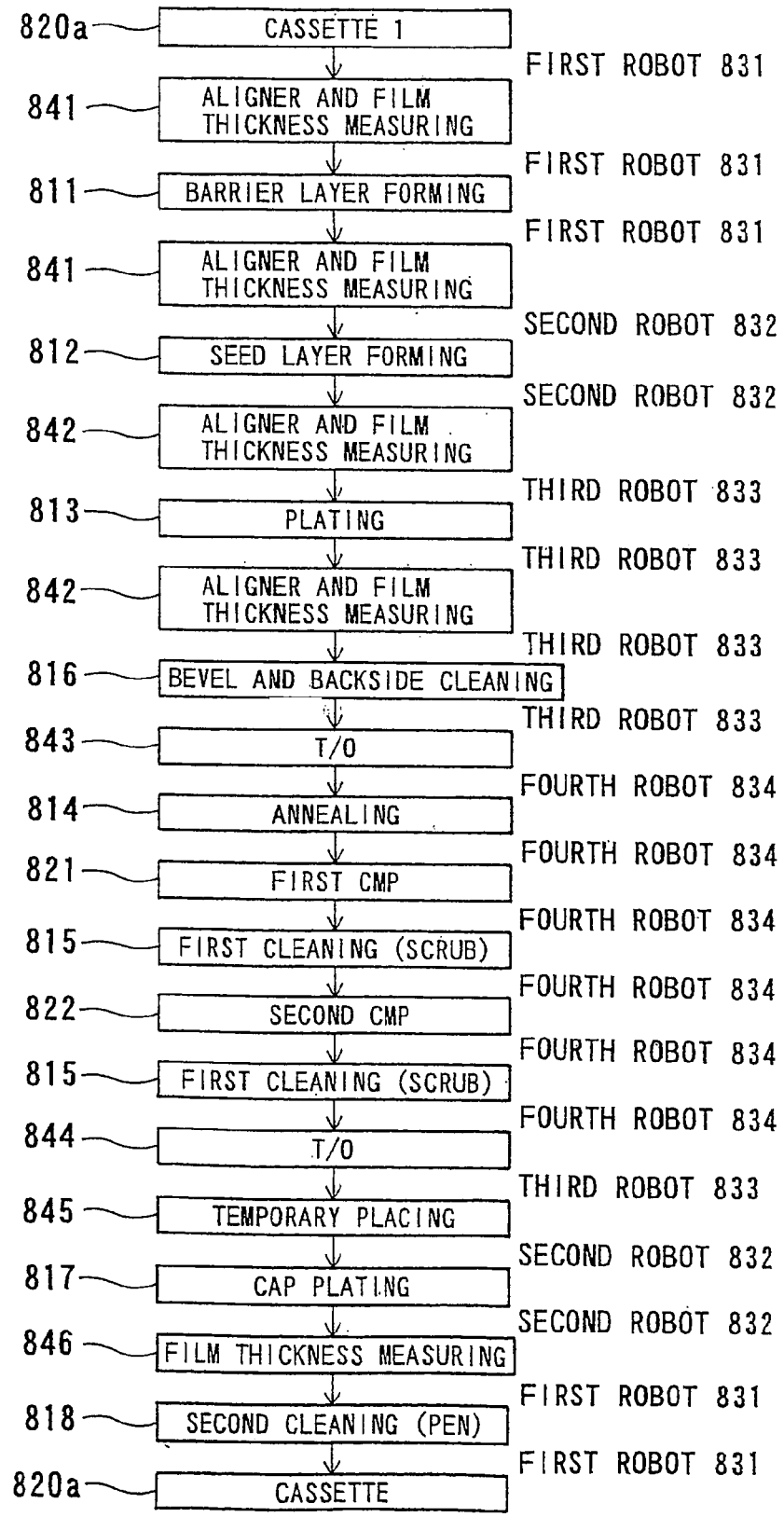
FIG. 21 is a view showing a flow of the respective steps in the semiconductor substrate processing apparatus illustrated in FIG. 20.

FIG. 21 is a flow chart showing the flow of the respective steps in the present substrate processing apparatus. The respective steps in the apparatus will be described according to this flow chart. First, a semiconductor substrate taken out by the first robot 831 from a cassette 820a placed on the load and unload section 820 is placed in the first aligner and film thickness measuring instrument 841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transferred to the barrier layer forming unit 811 by the first robot 831. The barrier layer forming unit 811 is such an apparatus for forming a barrier layer on the semiconductor substrate by electroless Co—B plating, and the barrier layer forming unit 811 forms an Co—B film as a film for preventing Cu from diffusing into an interlayer insulator film (e.g. $SiO_2$) of a semiconductor device. The semiconductor substrate discharged after cleaning and drying steps is transferred by the first robot 831 to the first aligner and film thickness measuring instrument 841, where the film thickness of the semiconductor substrate, i.e., the film thickness of the barrier layer is measured.

The semiconductor substrate after film thickness measurement is carried into the seed layer forming unit 812 by the second robot 832, and a seed layer is formed on the barrier layer by electroless Cu plating. The semiconductor substrate discharged after cleaning and drying steps is transferred by the second robot 832 to the second aligner and film thickness measuring instrument 842 for determination of a notch position, before the semiconductor substrate is transferred to the plated film forming unit 813, which is an impregnation plating unit, and then notch alignment for Cu plating is performed by the film thickness measuring instrument 842. If necessary, the film thickness of the semiconductor substrate before formation of a Cu film may be measured again in the film thickness measuring instrument 842.

The semiconductor substrate which has completed notch alignment is transferred by the third robot 833 to the plated film forming unit 813 where Cu plating is applied to the semiconductor substrate. The semiconductor substrate discharged after cleaning and drying steps is transferred by the third robot 833 to the bevel and backside cleaning unit 816 where an unnecessary Cu film (seed layer) at a peripheral portion of the semiconductor substrate is removed. In the bevel and backside cleaning unit 816, the bevel is etched in a preset time, and Cu adhering to the backside of the semiconductor substrate is cleaned with a chemical liquid such as hydrofluoric acid. At this time, before transferring the semiconductor substrate to the bevel and backside cleaning unit 816, film thickness measurement of the semiconductor substrate may be made by the second aligner and film thickness measuring instrument 842 to obtain the thickness value of the Cu film formed by plating, and based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel and backside cleaning unit 816 is transferred by the third robot 833 to the substrate reversing machine 843. After the semiconductor substrate is turned over by the substrate reversing machine 843 to cause the plated surface to be directed downward, the semiconductor substrate is introduced into the annealing unit 814 by the fourth robot 834 for there by stabilizing an interconnection portion. Before and/or after annealing treatment, the semiconductor substrate is carried into the second aligner and film thickness measuring instrument 842 where the film thickness of a copper film formed on the semiconductor substrate is measured. Then, the semiconductor substrate is carried by the fourth robot 834 into the first polishing apparatus 821 in which the Cu film and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transferred by the fourth robot 834 to the first cleaning unit 815 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transferred by the fourth robot 834 to the second polishing apparatus 822 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transferred by the fourth robot 834 again to the first cleaning unit 815 where scrub-cleaning is performed. After completion of cleaning, the semiconductor substrate is transferred by the fourth robot 834 to the second substrate reversing machine 844 where the semiconductor substrate is reversed to cause the plated surface to be directed upward, and then the semiconductor substrate is placed on the substrate temporary placing table 845 by the third robot.

The semiconductor substrate is transferred by the second robot 832 from the substrate temporary placing table 845 to the cap plating unit 817 where cap plating is applied onto the Cu surface with the aim of preventing oxidation of Cu due to the atmosphere. The semiconductor substrate to which cap plating has been applied is carried by the second robot 832 from the cap plating unit 817 to the third film thickness measuring instrument 846 where the thickness of the copper film is measured. Thereafter, the semiconductor substrate is carried by the first robot 831 into the second cleaning unit 818 where it is cleaned with pure water or deionized water. The semiconductor substrate after completion of cleaning is returned into the cassette 820a placed on the loading/unloading section 820.

The aligner and film thickness measuring instrument 841 and the aligner and film thickness measuring instrument 842 perform positioning of the notch portion of the substrate and measurement of the film thickness.

The seed layer forming unit 812 may be omitted. In this case, a plated film may be formed on a barrier layer directly in a plated film forming unit 813.

Figure 22:
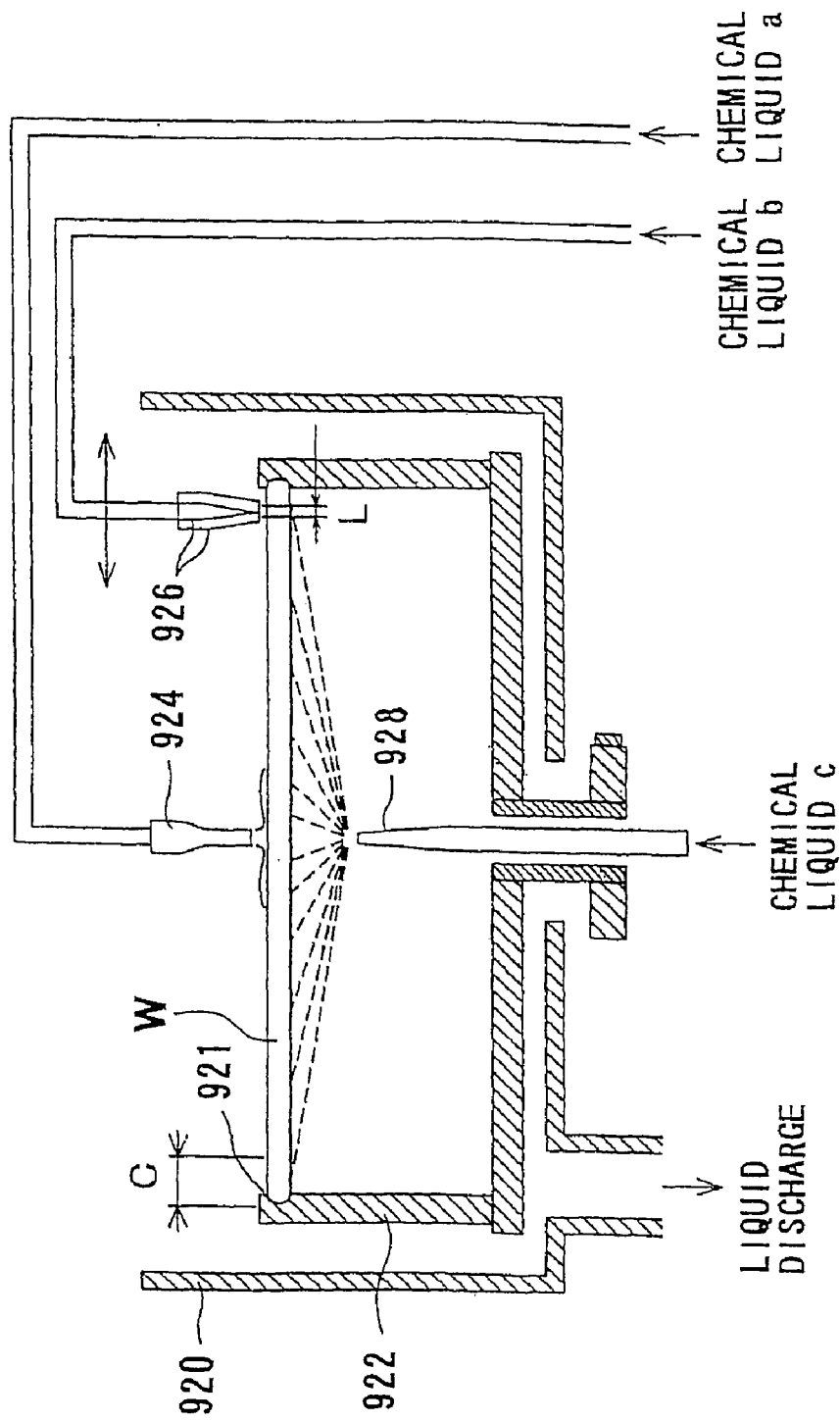
FIG. 22 is a view showing a schematic constitution example of a bevel and backside cleaning unit.

The bevel and backside cleaning unit 816 can perform an edge (bevel) Cu etching and a backside cleaning at the same time, and can suppress growth of a natural oxide film of copper at the circuit formation portion on the surface of the substrate. FIG. 22 shows a schematic view of the bevel and backside cleaning unit 816. As shown in FIG. 22, the bevel and backside cleaning unit 816 has a substrate holding portion 922 positioned inside a bottomed cylindrical waterproof cover 920 and adapted to rotate a substrate W at a high speed, in such a state that the face of the substrate W faces upwardly, while holding the substrate W horizontally by spin chucks 921 at a plurality of locations along a circumferential direction of a peripheral edge portion of the substrate, a center nozzle 924 placed above a nearly central portion of the face of the substrate W held by the substrate holding portion 922, and an edge nozzle 926 placed above the peripheral edge portion of the substrate W. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film within the edge cut width C can be removed.

Next, the method of cleaning with this cleaning apparatus will be described. First, the semiconductor substrate W is horizontally rotated integrally with the substrate holding portion 922, with the substrate being held horizontally by the spin chucks 921 of the substrate holding portion 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion of the semiconductor substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase of the electrical resistance. In the presence of annealing, thin interconnection showed no voids. Thus, the degree of grain growth is presumed to be involved in these phenomena. That is, the following mechanism can be speculated: Grain growth is difficult to occur in thin interconnection. In broad interconnection, on the other hand, grain growth proceeds in accordance with annealing treatment. During the process of grain growth, ultra-fine pores in the plated film, which are too small to be seen by the SEM (scanning electron microscope), gather and move upward, thus forming microvoid-like depressions in the upper part of the interconnection. The annealing conditions in the annealing unit 814 are such that hydrogen (2% or less) is added in a gas atmosphere, the temperature is in the range of 300° C. to 400° C., and the time is in the range of 1 to 5 minutes. Under these conditions, the above effects were obtained.

Figure 23:
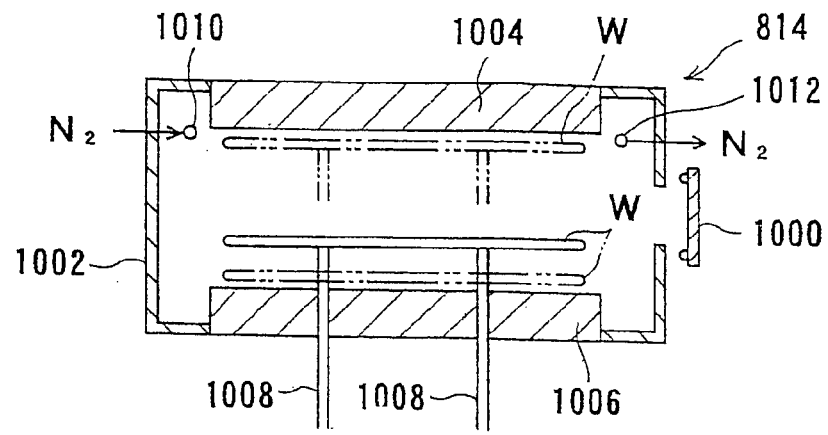
FIG. 23 is a vertical sectional view of an example of an annealing unit.
Figure 24:
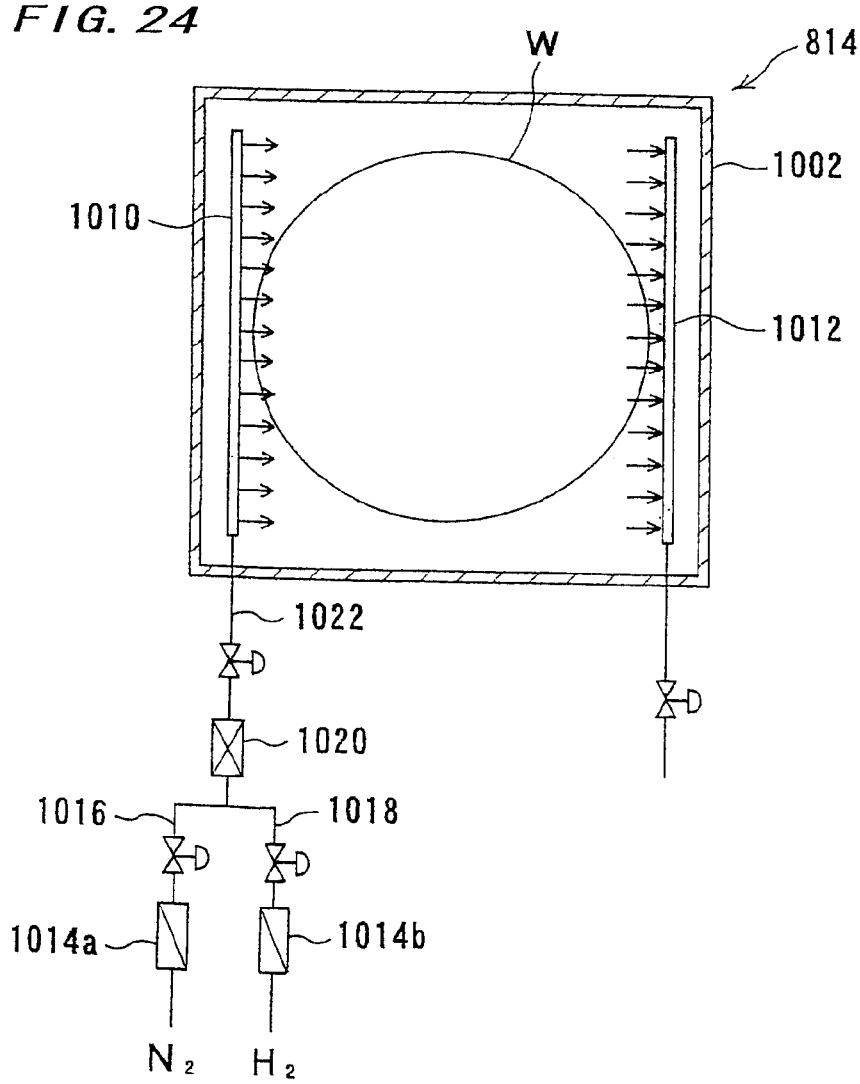
FIG. 24 is a transverse sectional view of the annealing unit.

FIGS. 23 and 24 show the annealing unit 814. The annealing unit 814 comprises a chamber 1002 having a gate 1000 for taking in and taking out the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 814 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes e.g. 0.1–1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100–600° C.

After the completion of the annealing, the elevating pins 1008 are lowered down to a position at which the distance between the semiconductor substrate W held on the elevating pins 1008 and the cool plate 1006 becomes e.g. 0–0.5 mm. In this state, by introducing a cooling water into the cool plate 1006, the semiconductor substrate W is cooled by the cool plate to a temperature of 100° C. or lower in e.g. 10–60 seconds. The cooled semiconductor substrate is sent to the next step.

A mixed gas of $N_2$ gas with several % of $H_2$ gas is used as the above antioxidant gas. However, $N_2$ gas may be used singly.

The annealing unit may be placed in the electroplating apparatus.

The cap plating described above is preferably performed by electroless plating process, but may be performed by electroplating process.

Although certain preferred embodiments of the present invention have been shown and described in detail, it should be understood that various changes and modifications may be made therein without departing from the scope of the appended claims.

This invention relates to an electroless plating apparatus and method useful for forming an embedded interconnects that an electric conductor, such as copper or silver, is embedded in fine recesses for interconnects formed in the surface of a substrate like a semiconductor substrate, and for forming a protective layer for protecting the surface of the interconnects.

The invention claimed is:

1. A substrate processing apparatus, comprising:
   a processing bath for holding a processing liquid; and
   a substrate holder which is vertically movable between inside of the processing bath and above the processing bath, and which includes a plurality of substrate holding portions for holding a plurality of substrates in parallel;
   wherein each substrate holding portion includes
   (i) a substrate stage and a substrate presser, which can move close to or away from each other and can grip therebetween a peripheral portion of a substrate to thereby hold the substrate with its back surface sealed, and
   (ii) a heating medium flow passage for passing a heating medium therethrough so as to regulate the temperature of the substrate holding portion said heating medium being composed of a spiral circulation tube provided in the interior of a peripheral portion of the substrate presser or the substrate stage.

2. The substrate processing apparatus according to claim 1, further comprising a processing liquid circulation system for circulating a processing liquid in the processing bath.

3. The substrate processing apparatus according to claim 1, further comprising a pressurized fluid introduction section for introducing a pressurized fluid into a space which is formed between the substrate presser and the substrate when the substrate is held in the substrate holding portion.

4. The substrate processing apparatus according to claim 1, wherein the substrate holder can make at least one of rotational movement and tilting movement.

5. A substrate processing method, comprising:
   allowing a plurality of substrates to be held in parallel in a plurality of substrate holding portions of a substrate holder, each of the substrate holding portions having a substrate presser and a substrate stage;
   introducing a heating fluid into each heating medium flow passage, composed of a spiral circulation tube provided in the interior of a peripheral portion of the substrate presser or the substrate stage, for passing a heating medium therethrough so as to regulate the temperature of the substrate holding portion; and
   immersing the substrate holder with a plurality of substrates held in the substrate holding portions in a processing liquid held in a processing bath to carry out processing of the substrates.

6. The substrate processing method according to claim 5, wherein the substrate holder with the plurality of substrates is kept immersed in the processing liquid while allowing the substrate holder to make a vertical movement, rotational movement, tilting movement, or a combined movement thereof.

7. A substrate plating apparatus, comprising:
   a plating bath for holding a plating solution;
   a plating solution circulation system for circulating the plating solution in the plating bath; and
   a substrate holder which is vertically movable between inside of the plating bath and above the plating bath, and which includes a plurality of substrate holding portions for holding a plurality of substrates in parallel;
   wherein each substrate holding portion includes
   (i) a substrate stage and a substrate presser, which can move close to or away from each other and can grip therebetween a peripheral portion of a substrate to thereby hold the substrate with its back surface sealed, and
   (ii) a heating medium flow passage for passing a heating medium therethrough so as to control the temperature of the substrate holding portion, said heating medium being composed of a spiral circulation tube provided in the interior of a peripheral portion of the substrate presser or the substrate stage.

8. The substrate plating apparatus according to claim 7, further comprising a pressurized fluid introduction section for introducing a pressurized fluid into a space which is formed between the substrate presser and the substrate when the substrate is held in the substrate holding portion.

9. The substrate plating apparatus according to claim 7, wherein the substrate holder can make at least one of rotational movement and tilting movement.

10. The substrate plating apparatus according to claim 7, wherein the substrate presser has an inner seal member and an outer seal member, and the substrate stage has a seal ring, so that the back surface of the substrate is covered with the substrate presser and the peripheral region of the substrate is sealed with the seal ring and the seal members when the substrate is held in the substrate holding portion.

11. The substrate plating apparatus according to claim 7, wherein the plating bath has a double bath structure which includes an inner bath and an outer bath.

12. A substrate plating method, comprising:
   allowing a plurality of substrates to be held in parallel in a plurality of substrate holding portions of a substrate holder, each of the substrate holding portions having a substrate presser and a substrate stage;

introducing a heating medium into each heating medium flow passage, composed of a spiral circulation tube provided in the interior of a peripheral portion of the substrate presser or the substrate stage, for passing a heating medium therethrough so as to regulate the temperature of the substrate holding portion; and immersing the substrate holder with the plurality of substrates held in the substrate holding portions into a plating solution held in a plating bath to carry out plating of the substrates, wherein a flow of the plating solution is stopped throughout the plating.

13. The substrate plating method according to claim 12, wherein the substrate holder with the plurality of substrates are kept immersed in the plating solution while allowing the substrate holder to make a vertical movement, rotational movement, tilting movement, or a combined movement thereof.

* * * * *